US010892218B2

(12) United States Patent
Tsukamoto et al.

(10) Patent No.: US 10,892,218 B2
(45) Date of Patent: *Jan. 12, 2021

(54) SEMICONDUCTOR DEVICE

(71) Applicant: ROHM CO., LTD., Kyoto (JP)

(72) Inventors: Yoshihisa Tsukamoto, Kyoto (JP);
Masashi Hayashiguchi, Kyoto (JP);
Soichiro Takahashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/597,149

(22) Filed: Oct. 9, 2019

(65) Prior Publication Data

US 2020/0043843 A1 Feb. 6, 2020

Related U.S. Application Data

(60) Continuation of application No. 16/218,017, filed on Dec. 12, 2018, now Pat. No. 10,490,494, which is a
(Continued)

(30) Foreign Application Priority Data

Feb. 26, 2015 (JP) ................................. 2015-037225

(51) Int. Cl.
*H01L 23/522* (2006.01)
*H01L 25/07* (2006.01)
(Continued)

(52) U.S. Cl.
CPC ............ *H01L 23/522* (2013.01); *H01L 23/34* (2013.01); *H01L 23/535* (2013.01);
(Continued)

(58) Field of Classification Search
CPC ..... H01L 23/522; H01L 23/34; H01L 23/535; H01L 23/538; H01L 25/07; H01L 25/18;
(Continued)

(56) References Cited

U.S. PATENT DOCUMENTS 6,054,765 A 4/2000 Eytcheson et al.
10,192,820 B2 * 1/2019 Tsukamoto ........... H01L 23/535
(Continued)

FOREIGN PATENT DOCUMENTS

CN 101542903 9/2009
CN 102881682 1/2013
(Continued)

OTHER PUBLICATIONS

International Search Report for PCT/JP2016/053403, dated Apr. 19, 2016, 3 pages including English translation.
(Continued)

*Primary Examiner* — Timor Karimy
(74) *Attorney, Agent, or Firm* — Hamre, Schumann, Mueller & Larson, P.C.

(57) ABSTRACT

A first power supply terminal P is provided with an internal wiring connection portion 31A, an upright portion 31B which is joined to the internal wiring connection portion 31A, an inclined portion 31C which is joined to the upright portion 31B and an external wiring connection portion 31D which is joined to the inclined portion 31C. A second power supply terminal N is provided with an internal wiring connection portion 32A, an upright portion 32B which is joined to the internal wiring connection portion 32A, an inclined portion 32C which is joined to the upright portion 32B and an external wiring connection portion 32D which is joined to the inclined portion 32C. The upright portion 31B of the first power supply terminal P and the upright portion 32B of the second power supply terminal N are arranged so as to face each other, with a predetermined interval kept therebetween.

12 Claims, 11 Drawing Sheets

Related U.S. Application Data division of application No. 15/553,792, filed as application No. PCT/JP2016/053403 on Feb. 4, 2016, now Pat. No. 10,192,820.

(51) Int. Cl.
  *H01L 25/18* (2006.01)
  *H01L 23/34* (2006.01)
  *H01L 23/535* (2006.01)
  *H01L 23/538* (2006.01)
  *H02M 3/155* (2006.01)

(52) U.S. Cl.
  CPC ............ *H01L 23/538* (2013.01); *H01L 25/07* (2013.01); *H01L 25/18* (2013.01); *H02M 3/155* (2013.01); *H01L 2224/371* (2013.01); *H01L 2224/3754* (2013.01); *H01L 2224/40225* (2013.01); *H01L 2224/48227* (2013.01)

(58) Field of Classification Search
  CPC ....... H01L 2224/371; H01L 2224/3754; H01L 2224/40225; H01L 2224/48227; H02M 3/155
  See application file for complete search history.

(56) References Cited

U.S. PATENT DOCUMENTS

| | | | |
|---|---|---|---|
| 10,490,494 B2 * | 11/2019 | Tsukamoto | ............ H01L 23/34 |
| 2005/0057901 A1 | 3/2005 | Obu et al. | |
| 2008/0130223 A1 | 6/2008 | Nakamura et al. | |

FOREIGN PATENT DOCUMENTS

| | | |
|---|---|---|
| CN | 203562425 | 4/2014 |
| CN | 103856074 | 6/2014 |
| CN | 104051445 | 9/2014 |
| CN | 104380462 | 2/2015 |
| CN | 104412383 | 3/2015 |
| EP | 2590309 | 5/2013 |
| JP | H07231071 | 8/1995 |
| JP | 2003133515 | 5/2003 |
| JP | 2004095769 | 3/2004 |
| JP | 2007236044 | 9/2007 |
| JP | 2009081993 | 4/2009 |
| JP | 2011097053 | 5/2011 |
| JP | 2012235128 | 11/2012 |
| JP | 2013021107 | 1/2013 |
| JP | 2013222885 | 10/2013 |
| JP | 2016162773 | 9/2016 |
| WO | 2015121899 | 8/2015 |

OTHER PUBLICATIONS

International Preliminary Report on Patentability for PCT/JP2016/053403, dated Sep. 8, 2017, 11 pages including English translation.
Office Action issued for Japanese Patent Application No. 2015-037225, dated Aug. 16, 2018, 4 pages including English translation.
Extended European Search Report issued for European Patent Application No. 16755167.0, dated Oct. 11, 2018, 9 pages.
Decision to Grant a Patent issued for Japanese Patent Application No. 2015-037225, Dispatch Date: Aug. 22, 2019, 5 pages including English machine translation.
Office Action issued for Chinese Patent Application No. 201680012180.2, dated Sep. 18, 2019, 34 pages including English machine translation.
Office Action issued for Japanese Patent Application No. 2019-173356, dated Sep. 24, 2020, 12 pages, including English machine translation.

* cited by examiner

SEMICONDUCTOR DEVICE

TECHNICAL FIELD

The present invention relates to a semiconductor device such as a power module.

BACKGROUND ART

A power module is a device in which a pair of switching elements are connected in series to a power supply to obtain an output from between the pair of switching elements. Such a power module is, for example, used for an inverter circuit which forms a driving circuit to drive an electric motor. The electric motor is used as, for example, a power source of an electric vehicle (including a hybrid car), a train, an industrial robot and the like. The power module is also applied to an inverter circuit that converts electric power generated by a solar battery, a wind power generator and other power generators (particularly, a private electric generator) so as to match the electric power of a commercial power supply.

For the switching elements of power modules, devices using Si (silicon) semiconductors have been conventionally used. However, there has been a problem of losses in the devices at the time of power conversion, and the situation is that a further improvement in efficiency of the devices using Si materials is no longer feasible.

Therefore, a power module using, as its switching elements, power devices using SiC (silicon carbide) semiconductors has been proposed. The SiC power devices are capable of conducting a high-speed ON/OFF operation because switching speed is high. Consequently, a current quickly decreases at the time of switch-off so that switching loss can be reduced.

PRIOR ART DOCUMENTS

Patent Documents

Patent Document 1: Japanese Patent Application Publication No. 2003-133515

Patent Document 2: Japanese Patent Application Publication No. 2004-95769

SUMMARY OF THE INVENTION

Problems to be Solved by the Invention

However, high-speed switching by the SiC power devices causes a new problem that an increase in surge voltage at the time of switching occurs.

The surge voltage V is, as shown in the following formula (A), given by a product of a self-inductance L which internal wiring of the power module has and a differential (di/dt) of a current i by a time t (current change ratio per hour).

$$V = L \cdot (di/dt) \tag{A}$$

The higher the switching speed, the greater the change ratio (di/dt) of the current i, so that the surge voltage V is increased. When the surge voltage loads the devices with a voltage not less than a breakdown voltage, the devices may be broken. Moreover, when the surge voltage is great, there are also concerns of an increase in EMI (electromagnetic interference) noise and a reduction in reliability.

Therefore, in order to reduce surge voltage while applying high-speed switching elements such as SiC devices, it is necessary to reduce the self-inductance L which the internal wiring of the power module has. This problem is common not only to power modules but also to semiconductor devices having switching elements. Of course, also in semiconductor devices having switching elements using Si semiconductors, a reduction in surge voltage is a significant problem.

An object of the present invention is to provide a semiconductor device capable of realizing a power module with a small self-inductance of internal wiring.

Means for Solving the Problems

A first semiconductor device according to the present invention includes a first power supply terminal and a second power supply terminal which are arranged so as to be adjacent in a predetermined one direction in a plan view, an output terminal which is arranged, with an interval kept, in an orthogonal direction to the one direction with respect to the first power supply terminal and the second power supply terminal in a plan view, a first circuit which includes a first switching element electrically connected between the first power supply terminal and the output terminal, and a second circuit which includes a second switching element electrically connected between the output terminal and the second power supply terminal.

The first power supply terminal includes a first internal wiring connection portion and a first external wiring connection portion which are flat plate-shaped and arranged so as to face each other, with an interval kept, in a vertical direction along a plan view direction, and a first coupling portion which couples an edge portion of the first internal wiring connection portion and that of the first external wiring connection portion on the side of the second power supply terminal. The second power supply terminal includes a second internal wiring connection portion and a second external wiring connection portion which are flat plate-shaped and arranged so as to face each other, with an interval kept, in a vertical direction along a plan view direction, and a second coupling portion which couples an edge portion of the second internal wiring connection portion and that of the second external wiring connection portion on the side of the first power supply terminal. The first coupling portion and the second coupling portion each include plate-shaped facing portions facing each other, with a predetermined interval kept therebetween.

During a transition period when the first switching element inside the first circuit is switched from a conductive state to a cutoff state and the second switching element inside the second circuit is switched from a cutoff state to a conductive state, a current flows from the external wiring connection portion to the internal wiring connection portion in one of the first power supply terminal and the second power supply terminal, and a current flows from the internal wiring connection portion to the external wiring connection portion in the other of them.

Also during a transition period when the second switching element inside the second circuit is switched from a conductive state to a cutoff state and the switching element inside the first circuit is switched from a cutoff state to a conductive state, a current flows from the external wiring connection portion to the internal wiring connection portion in one of the first power supply terminal and the second power supply terminal, and a current flows from the internal wiring connection portion to the external wiring connection portion in the other of them.

During the above-described transition period, a direction at which a current flows at the plate-shaped facing portion of the first coupling portion in the first power supply terminal and a direction at which a current flows at the plate-shaped facing portion of the second coupling portion in the second power supply terminal are reverse to each other. The plate-shaped facing portion of the first coupling portion and the plate-shaped facing portion of the second coupling portion at which a current flows in a mutually reverse direction face each other, with a predetermined interval kept therebetween. Accordingly, during the transition period, self-inductance of the first power supply terminal and self-inductance of the second power supply terminal can cancel each other out, by which it is possible to provide a semiconductor device with a low self-inductance of internal wiring.

In one preferred embodiment of the present invention, the first external wiring connection portion is arranged above the first internal wiring connection portion. The first coupling portion includes a flat plate-shaped first upright portion which rises up from the edge portion of the first internal wiring connection portion on the side of the second power supply terminal and a flat plate-shaped first inclined portion which extends diagonally upward from an upper edge portion of the first upright portion so as to be further spaced away from the second power supply terminal as it moves upward and which is coupled to the edge portion of the first external wiring connection portion on the side of the second power supply terminal. The second external wiring connection portion is arranged above the second internal wiring connection portion. The second coupling portion includes a flat plate-shaped second upright portion which rises up from an edge portion of the second internal wiring connection portion on the side of the first power supply terminal and a flat plate-shaped second inclined portion which extends diagonally upward from an upper edge portion of the second upright portion so as to be further spaced away from the first power supply terminal as it moves upward and which is coupled to an edge portion of the second external wiring connection portion on the side of the first power supply terminal. The first upright portion and the second upright portion constitute the plate-shaped facing portions which face each other.

In one preferred embodiment of the present invention, the plate-shaped facing portions which face each other are each formed in a rectangular shape when viewed in the one direction, a clearance between the plate-shaped facing portions which face each other is 2 mm or less, the plate-shaped facing portion is 5 mm or more in height and the plate-shaped facing portion is 14 mm or more in width. In this constitution, self-inductance of the first power supply terminal and self-inductance of the second power supply terminal can be efficiently cancelled out.

In one preferred embodiment of the present invention, the first circuit includes a first element bonding conductor layer to which the first power supply terminal is electrically connected and also the first switching element is bonded via a first solder layer. The second circuit includes a second element bonding conductor layer to which the output terminal is electrically connected and also the second switching element is bonded via a second solder layer and a second power supply terminal conductor layer to which the second power supply terminal is electrically connected. The semiconductor device includes a first connection metal member in which a surface which is an opposite side to a surface of the first switching element which is bonded to the first element bonding conductor layer is electrically connected to the second element bonding conductor layer and also a second connection metal member in which a surface which is an opposite side to a surface of the second switching element which is bonded to the second element bonding conductor layer is electrically connected to the second power supply terminal conductor layer.

In this constitution, a first electrode (for example, a drain electrode) of the first switching element is electrically connected to the first power supply terminal via the first element bonding conductor layer. A first electrode (for example, a drain electrode) of the second switching element is electrically connected to the output terminal via the second element bonding conductor layer. A second electrode (for example, a source electrode) of the first switching element is electrically connected to the output terminal via the first connection metal member and the second element bonding conductor layer, and also electrically connected to a first electrode (for example, a drain electrode) of the second switching element. A second electrode (for example, a source electrode) of the second switching element is electrically connected to the second power supply terminal via the second connection metal member and the second power supply terminal conductor layer.

In one preferred embodiment of the present invention, the first circuit also includes a first diode element bonded to the first element bonding conductor layer via a third solder layer. The second circuit also includes a second diode element bonded to the second element bonding conductor layer via a fourth solder layer. The first connection metal member is constituted so that a surface which is an opposite side to a surface of the first switching element and that of the first diode element which are bonded to the first element bonding-conductor layer is electrically connected to the second element bonding conductor layer. The second connection metal member is constituted so that a surface which is an opposite side to a surface of the second switching element and that of the second diode element which are bonded to the second element bonding conductor layer is electrically connected to the second power supply terminal conductor layer.

In this constitution, the first electrode (for example, a drain electrode) of the first switching element and the first electrode (for example, a cathode electrode) of the first diode element are electrically connected to the first power supply terminal via the first element bonding conductor layer. The first electrode (for example, a drain electrode) of the second switching element and the first electrode (for example, a cathode electrode) of the second diode element are electrically connected to the output terminal via the second element bonding conductor layer. The second electrode (for example, a source electrode) of the first switching element and the second electrode (for example, an anode electrode) of the first diode element are electrically connected to the output terminal via the first connection metal member and the second element bonding conductor layer and also electrically connected to the first electrode (for example, a drain electrode) of the second switching element. The second electrode (for example, a source electrode) of the second switching element and the second electrode (for example, an anode electrode) of the second diode element are electrically connected to the second power supply terminal via the second connection metal member and the second power supply terminal conductor layer.

In one preferred embodiment of the present invention, the first connection metal member and the second connection metal member are each constituted with a conductive plate-shaped body. In this constitution, as compared with a case where a wire is used as the first connection metal member, it is possible to reduce self-inductance of internal wiring and also reduce thermal resistance of a semiconductor device.

In one preferred embodiment of the present invention, the first connection metal member and the second connection metal member are each made of a copper plate or a copper plate to which nickel-plating is applied.

In one preferred embodiment of the present invention, the first connection metal member and the second connection metal member are each from 0.8 mm or more to 2.0 mm or less in thickness. In this constitution, it is possible to reduce efficiently thermal resistance of the semiconductor device.

In one preferred embodiment of the present invention, there are also included a heat radiating plate and a substrate bonded to the heat radiating plate. The first element bonding conductor layer, the second element bonding conductor layer and the second power supply terminal conductor layer are formed on a surface of the substrate which is opposite to the side of the heat radiating plate.

In one preferred embodiment of the present invention, the first solder layer and the second solder layer are each from 0.08 mm or more to 0.10 mm or less in thickness. In this constitution, as compared with a case where the first solder layer and the second solder layer are each thicker than 0.10 mm in thickness, heat generated at the first switching element or the second switching element can be easily transmitted to the heat radiating plate. Accordingly, it is possible to reduce thermal resistance of the semiconductor device.

In one preferred embodiment of the present invention, the first solder layer and the second solder layer are made of Sn—Ag—Cu-based solder.

In one preferred embodiment of the present invention, the first circuit and the second circuit are assembled to the substrate. And, a surface (hereinafter, it may be referred to as a rear surface) which is an opposite side to a surface of the heat radiating plate on which the substrate is bonded is polished and flattened.

A heat sink and other cooling means are often mounted on the rear surface of the heat radiating plate. In this constitution, as compared with a case where the heat radiating plate is not flattened (thinned) by polishing the rear surface, heat generated at the first switching element or the second switching element is easily transmitted to the cooling means mounted on the rear surface of the heat radiating plate. Accordingly, it is possible to reduce thermal resistance of the semiconductor device.

In one preferred embodiment of the present invention, the first internal wiring connection portion of the first power supply terminal is provided with a first base portion and a first comb-shaped terminal which protrudes from the first base portion to the side of the output terminal. The second internal wiring connection portion of the second power supply terminal is provided with a second base portion and a second comb-shaped terminal which protrudes from the second base portion to the side of the output terminal. The first comb-shaped terminal is bonded to the first element bonding conductor layer (for example, by ultrasonic bonding), by which the first power supply terminal is electrically connected to the first element bonding conductor layer. The second comb-shaped terminal is bonded to the second power supply terminal conductor layer (for example, by ultrasonic bonding), by which the second power supply terminal is electrically connected to the second power supply terminal conductor layer.

In this constitution, the first power supply terminal and the second power supply terminal can be easily connected respectively to the first element bonding conductor layer and to the second power supply terminal conductor layer, as compared with a case where a wire is used.

A second semiconductor device according to the present invention includes a plate-shaped insulation substrate which is formed in a substantially rectangular shape, a circuit which is loaded on the insulation substrate and includes a semiconductor element, a first power supply terminal and a second power supply terminal which are mounted so as to be adjacent on the insulation substrate in a predetermined one direction of the insulation substrate in a plan view and which supply power to the circuit, and an output terminal which is mounted on the insulation substrate, with an interval kept, in an orthogonal direction to the one direction with respect to the first power supply terminal and the second power supply terminal in a plan view and which takes output from the circuit.

The first power supply terminal includes a first internal wiring connection portion and a first external wiring connection portion which are each formed in a flat plate-shape and arranged so as to face each other, with an interval kept, in the thickness direction of the insulation substrate, and a flat plate-shaped first coupling portion which couples an edge portion of the first internal wiring connection portion and that of the first external wiring connection portion on the side of the second power supply terminal. The second power supply terminal includes a second internal wiring connection portion and a second external wiring connection portion which are each formed in a flat plate-shape and arranged so as to face each other, with an interval kept, in the thickness direction of the insulation substrate, and a flat plate-shaped second coupling portion which couples an edge portion of the second internal wiring connection portion and that of the second external wiring connection portion on the side of the first power supply terminal. The first coupling portion and the second coupling portion each include a plate-shaped facing portion having a flat plate portion facing each other, with a predetermined interval kept therebetween. Also in this constitution, as with the foregoing first semiconductor device, it is possible to provide a semiconductor device with a low self-inductance of internal wiring.

In one preferred embodiment of the present invention, a clearance between the plate-shaped facing portions is smaller than a distance between the first external wiring connection portion and the second external wiring connection portion.

The above-described object of the present invention, or other objects, features and effects will be clarified by a description of preferred embodiments given by referring to the attached drawings.

DETAILED DESCRIPTION OF THE PREFERRED EMBODIMENTS

Hereinafter, preferred embodiments of the present invention will be described in detail with reference to the accompanying drawings.

Figure 1:
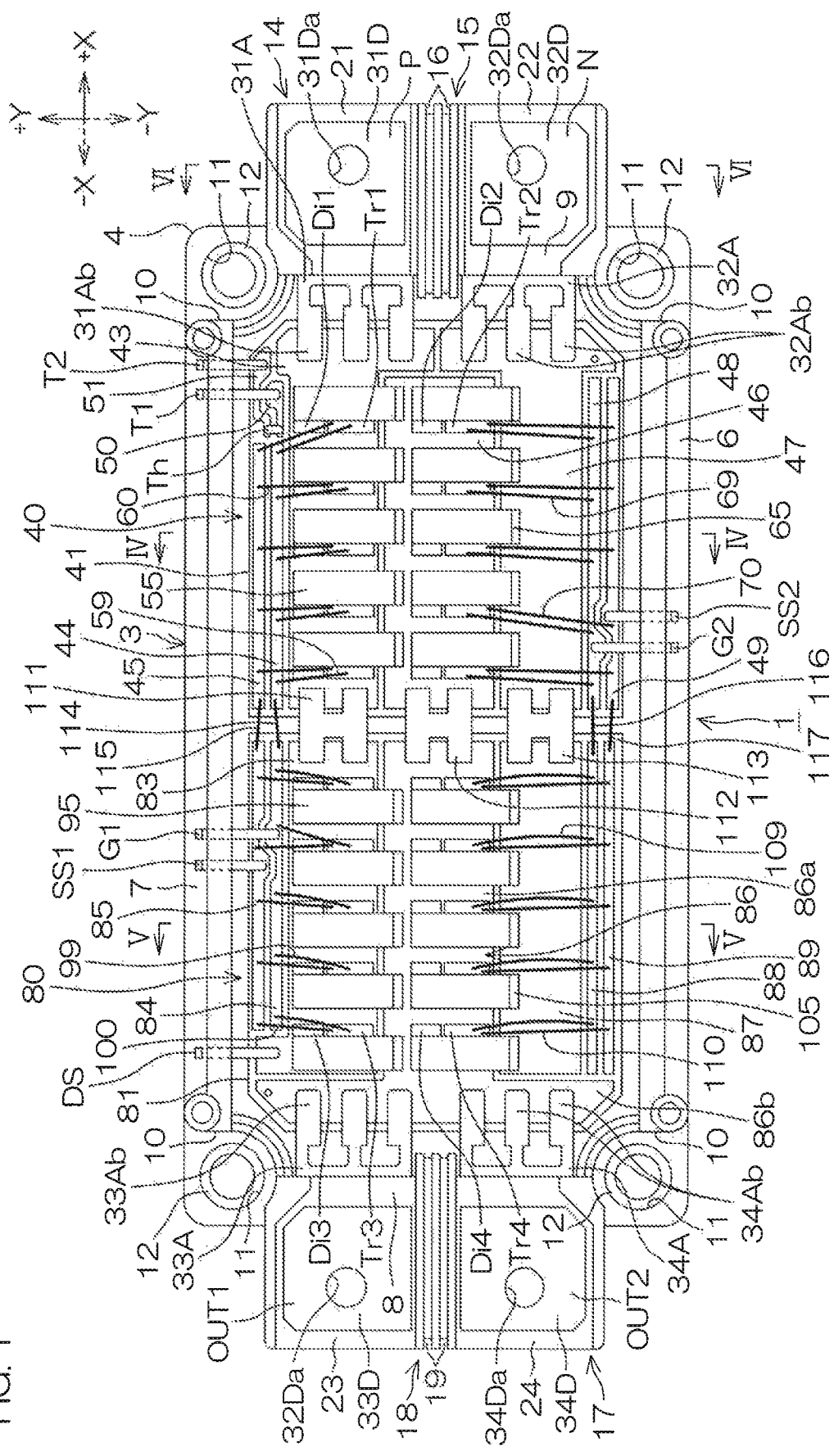
FIG. 1 is an illustrative plan view which shows an internal structure of a power module according to one preferred embodiment of the present invention.
Figure 2:
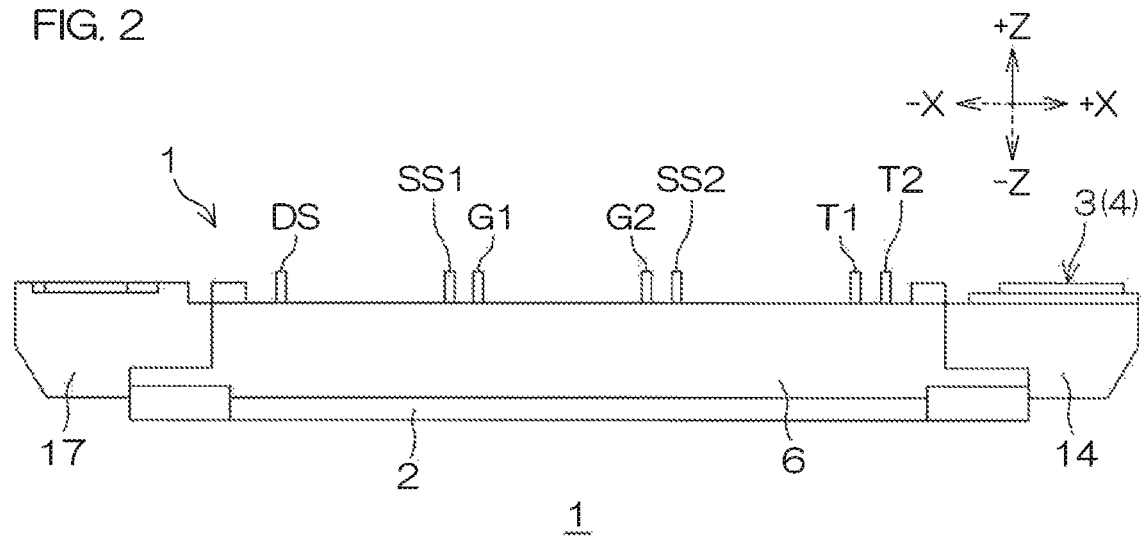
FIG. 2 is a right side view of FIG. 1.
Figure 3:
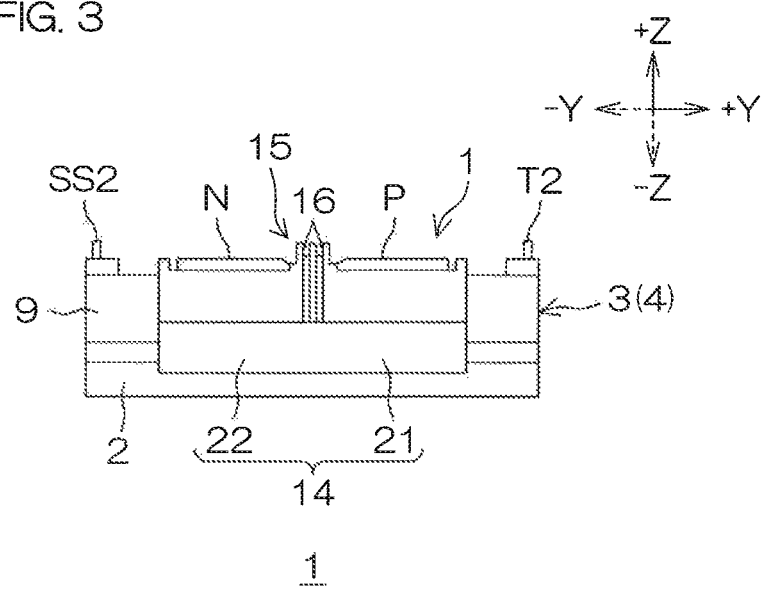
FIG. 3 is a rear view of FIG. 1.
Figure 4:
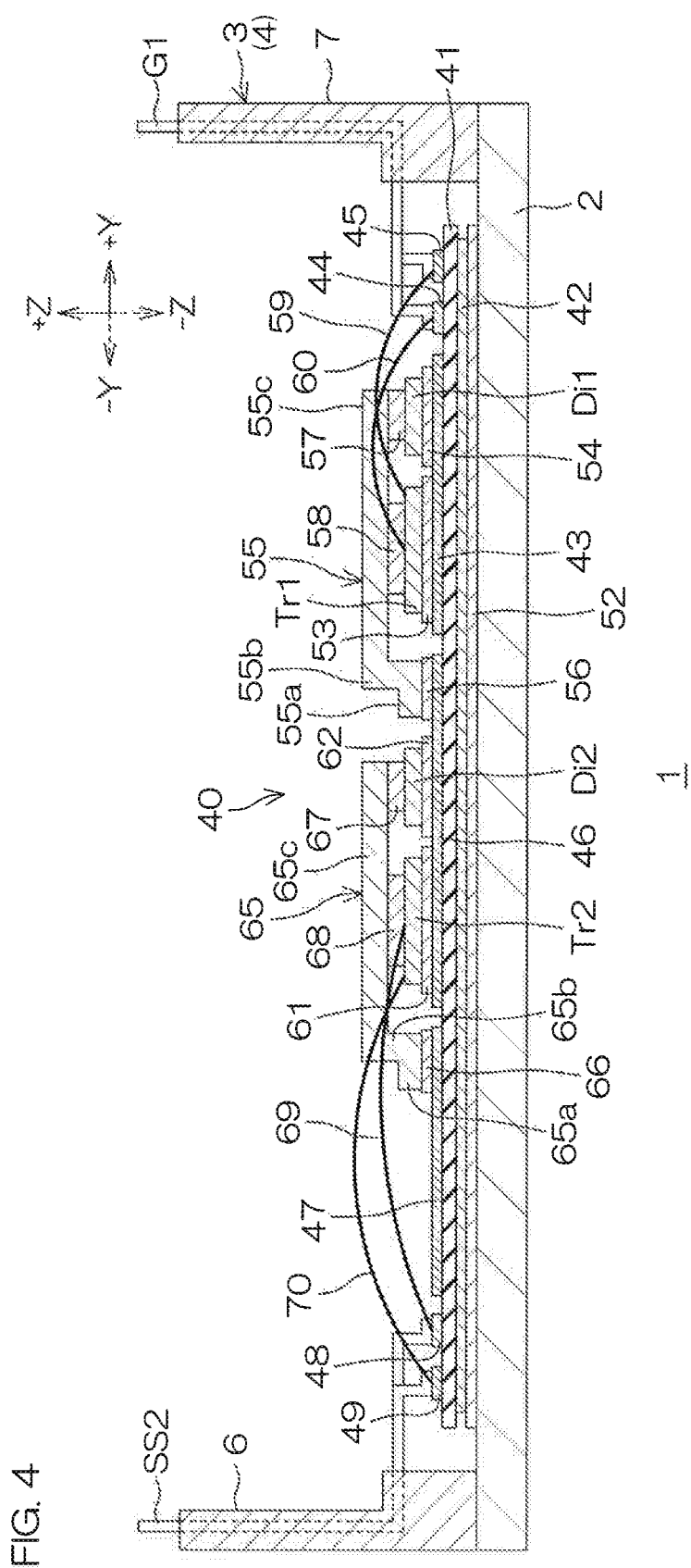
FIG. 4 is an illustrative sectional view taken along line IV-IV in FIG. 1.
Figure 5:
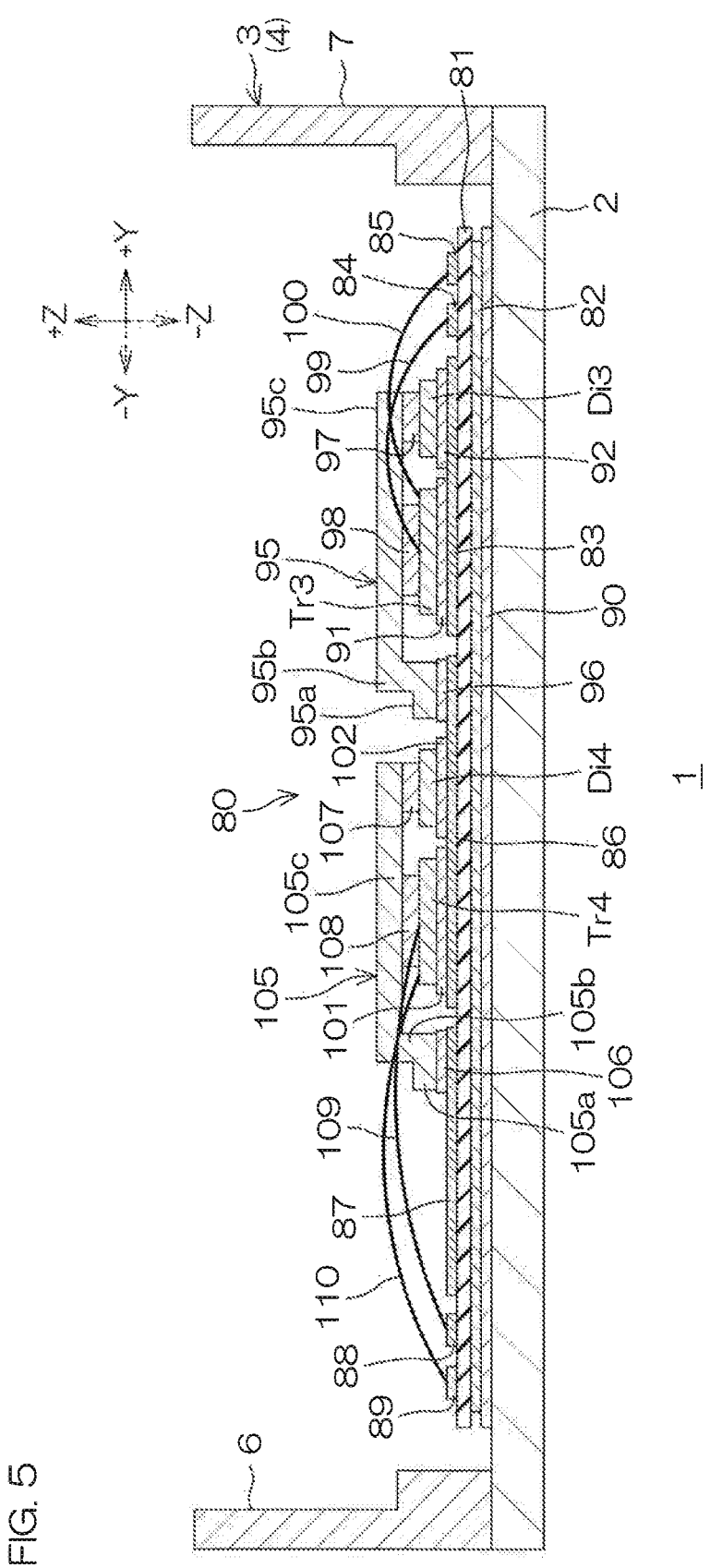
FIG. 5 is an illustrative sectional view taken along line V-V in FIG. 1.
Figure 6:
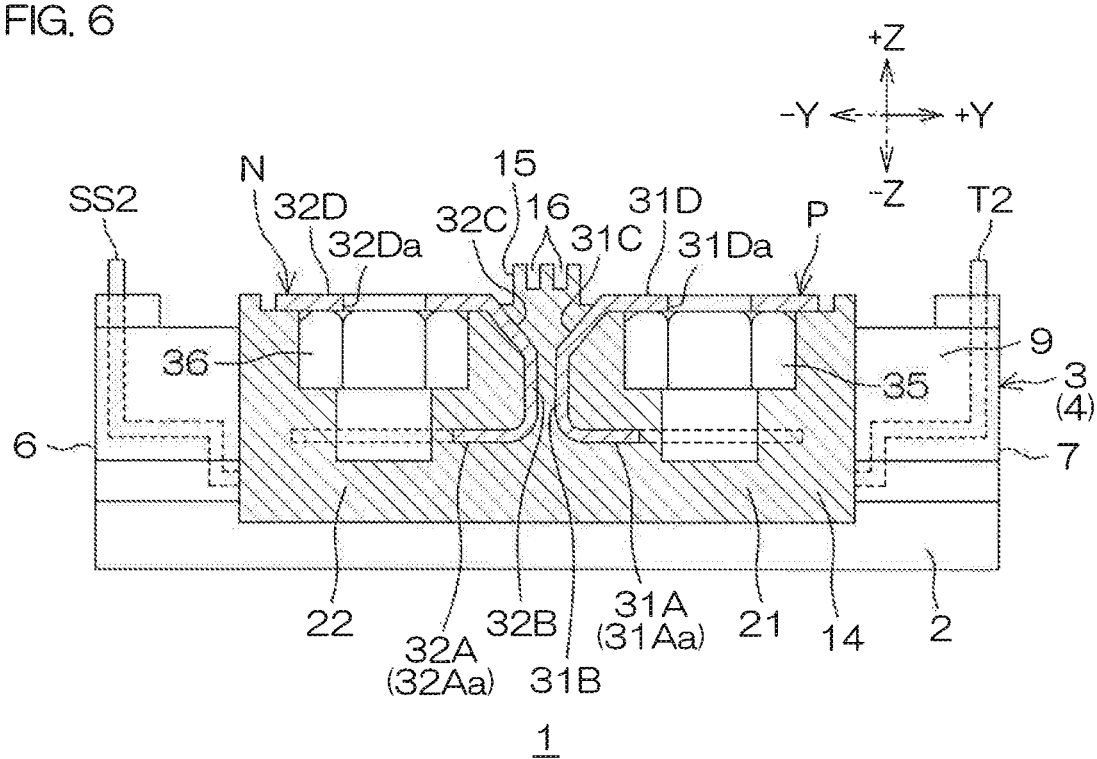
FIG. 6 is an illustrative enlarged sectional view taken along line VI-VI in FIG. 1.
Figure 7:
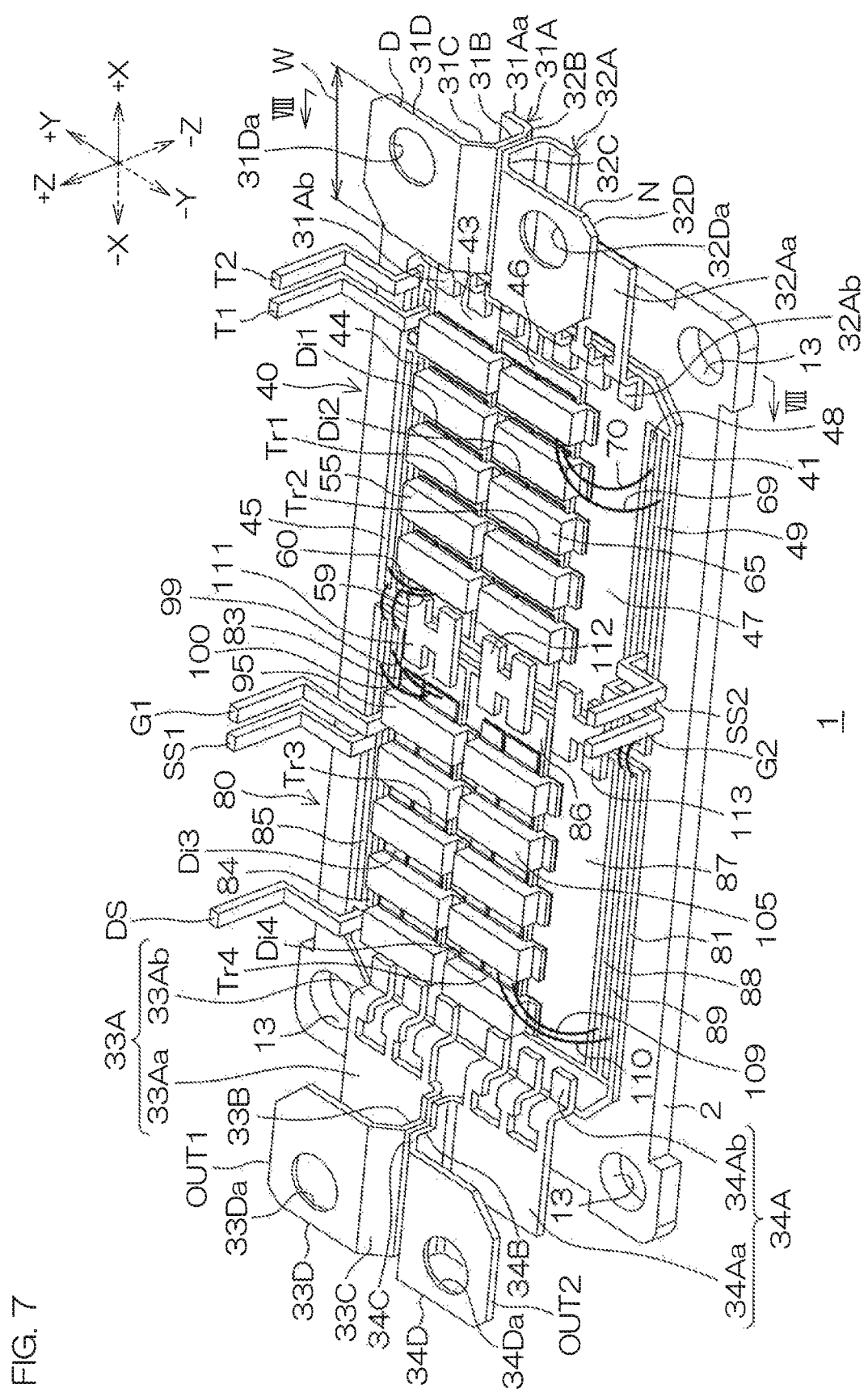
FIG. 7 is an illustrative perspective view for describing a constitution of a power module circuit which is housed in a case.
Figure 8:
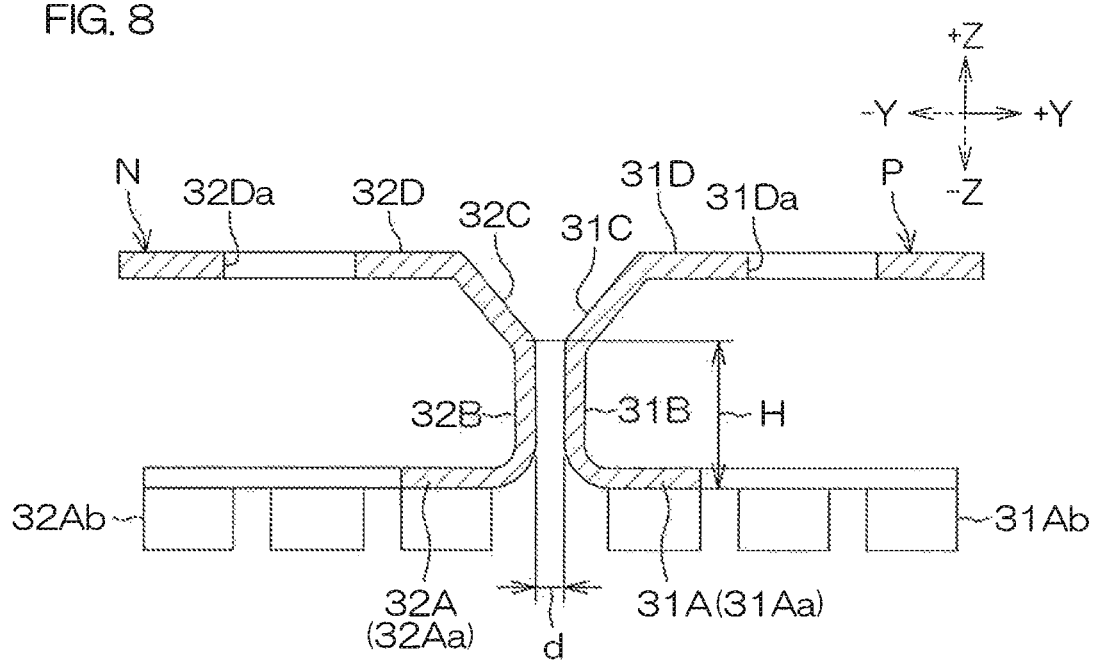
FIG. 8 is an illustrative enlarged sectional view taken along line VIII-VIII in FIG. 7.

FIG. 1 is an illustrative plan view which shows an internal structure of the power module according to one preferred embodiment of the present invention, showing a state in which a top plate is removed. FIG. 2 is a right side view of FIG. 1. FIG. 3 is a rear view of FIG. 1. FIG. 4 is an illustrative sectional view taken along line IV-IV in FIG. 1. FIG. 5 is an illustrative sectional view taken along line V-V in FIG. 1. FIG. 6 is an illustrative enlarged sectional view taken along line VI-VI in FIG. 1. FIG. 7 is an illustrative perspective view which explains a constitution of a power module circuit housed in a case. FIG. 8 is an illustrative enlarged sectional view taken along line VIII-VIII in FIG. 7. In FIG. 7, for clarification, wires 59, 60: 69, 70: 99, 100: 109, 110 are partially illustrated (only one set for each of them).

A power module 1 includes a heat radiating plate 2, a case 3 and a plurality of terminals assembled into the case 3. The plurality of terminals each include a first power supply terminal (in this example, a positive-electrode-side power supply terminal) P, a second power supply terminal (in this example, a negative-electrode-side power supply terminal) N and a first output terminal OUT1 and a second output terminal OUT2. The plurality of terminals also each include a drain sense terminal DS, a first source sense terminal SS1, a first gate terminal G1, first and second thermistor terminals T1, T2, a second source sense terminal SS2 and a second gate terminal G2. The first output terminal OUT1 and the second output terminal OUT2 are called an "output terminal OUT" when collectively mentioned.

For convenience of description, in the following, the +X direction, −X direction, +Y direction and −Y direction shown in FIG. 1 and +Z direction and −Z direction shown in FIG. 4 may be used. The +X direction and the −X direction are two directions along a long side of the case 3 (the heat radiating plate 2) having a substantially rectangular shape in a plan view, and they are simply called an "X direction" when collectively mentioned. The +Y direction and the −Y direction are two directions along a short side of the case 3, and they are simply called a "Y direction" when collectively mentioned. The +Z direction and the −Z direction are two directions along a normal of the heat radiating plate 2, and these directions are simply called a "Z direction" when collectively mentioned. When the heat radiating plate 2 is placed on a horizontal plane, the X direction and the Y direction serve as two horizontal directions (a first horizontal direction and second horizontal direction) along two straight lines (X axis and Y axis) orthogonal to each other, and the Z direction serves as a perpendicular direction (height direction) along a perpendicular straight line (Z axis).

The heat radiating plate 2 is a plate-shaped body with a uniform thickness having a rectangular shape in a plan view, and is made of a material high in heat conductivity. More specifically, the heat radiating plate 2 may be a copper plate made of copper. The copper plate may have a nickel plating layer formed on its surface. On a −Z direction-side surface of the heat radiating plate 2, a heat sink or other cooling means are mounted whenever necessary.

The case 3 is formed in a substantially rectangular parallelepiped shape and constituted with a resin material. It is in particular preferable to use a heat resistant resin such as PPS (polyphenylene sulfide). The case 3 assumes a rectangular shape substantially similar in size to the heat radiating plate 2 in a plan view and is provided with a frame portion 4 fixed to one surface of the heat radiating plate 2 (a +Z direction-side surface) and a top plate (not shown) fixed to the frame portion 4. The top plate blocks one side (a +Z direction side) of the frame portion 4 and faces one surface of the heat radiating plate 2 which blocks the other side (a −Z direction side) of the frame portion 4. Accordingly, the heat radiating plate 2, the frame portion 4 and the top plate define a circuit housing space inside the case 3. In this preferred embodiment, the frame portion 4 and the plurality of terminals are formed by simultaneous molding.

The frame portion 4 is provided with a pair of side walls 6, 7 and a pair of end walls 8, 9 in which both ends of the pair of side walls 6, 7 are joined to each other respectively. A recess portion 10 which is open outward is formed each at four corners on a +Z direction-side surface of the frame portion 4. An outward open portion of each recess portion 10 and a wall of an opposite side thereto are bent so as to protrude inwardly. On a bottom wall of the recess portion 10, there is formed a mounting through hole 11 which penetrates through the bottom wall. A tubular metal member 12 is fixed to the mounting through hole 11 in a fitted state. A mounting through hole 13 (refer to FIG. 7) communicatively connected to each mounting through hole 11 is formed on the heat radiating plate 2. The power module 1 is, by a bolt (not shown) inserted through the mounting through holes 11, 13 of the case 3 and the heat radiating plate 2, fixed to a predetermined fixing position of a mounting target. The foregoing cooling means such as a heat sink may be mounted by using the mounting through holes 11, 13.

On an outer surface of the end wall 9, there is formed a power supply terminal-use terminal block 14 having a rectangular shape long in the Y direction in a plan view. The power supply terminal-use terminal block 14 is formed integrally with the end wall 9. At a length-direction central portion of the surface (a +Z direction-side surface) of the end wall 9 and at a length-direction central portion of the surface of the power supply terminal-use terminal block 14, there is formed a protrusion portion 15 which extends in the X direction. On the surface of the protrusion portion 15, there are formed a plurality of grooves 16 extending in the X direction. A part covering the length-direction central portion of the power supply terminal-use terminal block 14 and the +Y direction side is a first power supply terminal P-use terminal block 21. A part covering the length-direction central portion of the power supply terminal-use terminal block 14 and the −Y direction-side is a second power supply terminal N-use terminal block 22.

On an outer surface of the end wall 8, there is formed an output terminal-use terminal block 17 having a rectangular shape long in the Y direction in a plan view. The output terminal-use terminal block 17 is formed integrally with the end wall 8. At a length-direction central portion of the surface (a +Z direction-side surface) of the end wall 8 and at a length-direction central portion of the surface of the output terminal-use terminal block 17, there is formed a protrusion portion 18 which extends in the X direction. On a surface of the protrusion portion 18, there are formed a plurality of grooves 19 extending in the X direction. A part covering the length-direction central portion of the output terminal-use terminal block 17 and the +Y direction-side is a first output terminal OUT1-use terminal block 23. A part covering the length-direction central portion of the output terminal-use terminal block 17 and the −Y direction-side is a second output terminal OUT2-use terminal block 24.

The first power supply terminal P is arranged on a surface (+Z direction-side surface) of a terminal block 21. The second power supply terminal N is arranged on a surface (+Z direction-side surface) of a terminal block 22. The first output terminal OUT1 is arranged on a surface (+Z direction-side surface) of a terminal block 23. The second output terminal OUT2 is arranged on a surface (+Z direction-side surface) of a terminal block 24.

The first power supply terminal P, the second power supply terminal N, the first output terminal OUT1 and the second output terminal OUT2 are each prepared by cutting out a conductive plate-shaped body (for example, a copper plate or a copper plate to which nickel plating is applied) into a predetermined shape and giving thereto a bending process, and they are electrically connected to a circuit inside the case 3. Front end portions of the first power supply terminal P, the second power supply terminal N, the first output terminal OUT1 and the second output terminal OUT2 are led out to the terminal blocks 21, 22, 23, 24 respectively. The front end portions of the first power supply terminal P, the second power supply terminal N, the first output terminal OUT1 and the second output terminal OUT2 are formed so as to extend along the respective surfaces of the terminal blocks 21, 22, 23, 24.

On the side wall 7 which is one of the side walls, there are mounted a drain sense terminal DS, a first source sense terminal SS1, a first gate terminal G1 as well as first and second thermistor terminals T1, T2. Front end portions of these terminals DS, SS1, G1, T1, T2 protrude from a surface (+Z direction-side surface) of the side wall 7 to the outside (+Z direction) of the case 3. The drain sense terminal DS is arranged so as to be close to a −X direction-side end of the side wall 7. The first and second thermistor terminals T1, T2 are arranged so as to be close to a +X direction-side end of the side wall 7, with an interval kept in the X direction. The first source sense terminal SS1 and the first gate terminal G1 are arranged between the −X direction-side end of the side wall 7 and the center thereof in the length direction (the X direction), with an interval kept in the X direction.

On the side wall 6 which is the other of the side walls, there are mounted a second gate terminal G2 and a second source sense terminal SS2. Front end portions of the terminals G2, SS2 protrude from a surface (+Z direction-side surface) of the side wall 6 to the outside (+Z direction) of the case 3. The second gate terminal G2 and the second source sense terminal SS2 are arranged between the center of the side wall 6 in the length direction (the X direction) and a +X direction-side end thereof, with an interval kept in the X direction. The drain sense terminal DS, the thermistor terminals T1, T2, the source sense terminals SS1, DD2 and the gate terminals G1, G2 are each prepared by giving a bending process to a metal rod having a rectangular shaped-cross section (for example, a rod-shaped copper body or a rod-shaped copper body to which nickel plating is applied) and electrically connected to a circuit inside the case 3.

With reference to FIG. 1, FIG. 6, FIG. 7 and FIG. 8, the first power supply terminal P is provided with an internal wiring connection portion 31A, an upright portion 31B joined to the internal wiring connection portion 31A, an inclined portion 31C joined to the upright portion 31B, and an external wiring connection portion 31D joined to the inclined portion 31C. The internal wiring connection portion 31A is provided with a substantially rectangular-shaped base portion 31Aa, the four sides of which are parallel to four sides of the heat radiating plate 2 in a plan view, and a comb-shaped terminal 31Ab which protrudes from a −X direction-side end of the base portion 31As to the −X direction. The base portion 31Aa is constituted with a plate-shaped body extending along an XY plane and formed in such a shape that, of four corners, a corner on the +X direction side and also on the +Y direction side is cut off. The comb-shaped terminal 31Ab is provided with three terminals which are arranged side by side in the Y direction. These terminals are each formed in a crank shape which extends from a −X direction-side end of the base portion 31Aa in the −X direction, thereafter, bending in the −Z direction and again extending in the −X direction. The base portion 31Aa is mostly embedded into the end wall 9 and the terminal block 21.

The upright portion 31B rises up in the +Z direction from a −Y direction-side edge of the base portion 31Aa at the internal wiring connection portion 31A. The upright portion 31B is constituted with a plate-shaped body extending along an XZ plane and formed so as to be substantially equal in width to a length of the −Y direction-side edge portion of the base portion 31Aa. The upright portion 31B is embedded into the end wall 9 and the terminal block 21. The inclined portion 31C is joined to a +Z direction-side edge portion of the upright portion 31B and extends obliquely in the +Z direction toward the +Y direction. The inclined portion 31C is constituted with the plate-shaped body extending in the oblique direction and formed so as to be substantially equal in width to the upright portion 31B. The inclined portion 31C is embedded into the end wall 9 and the terminal block 21.

The external wiring connection portion 31D is joined to a +Z direction-side edge portion of the inclined portion 31C and extends in the +Y direction. The external wiring connection portion 31D is constituted with a plate-shaped body along the XY plane and formed so as to be substantially equal in width to the inclined portion 31C. The external wiring connection portion 31D is arranged along a surface of the terminal block 21. Substantially at the central portion of the external wiring connection portion 31D, there is formed an external wiring connection-use insertion hole 31Da. On a −Z direction-side surface of the external wiring connection portion 31D, a nut 35 (refer to FIG. 6) is fixed so that a screw hole is in alignment with the insertion hole 31Da. The nut 35 is embedded into the terminal block 21.

The second power supply terminal N is formed in such a shape that gives a plane symmetry with the first power supply terminal P with respect to the XZ plane passing through a length center of the end wall 9. The second power supply terminal N is provided with an internal wiring connection portion 32A, an upright portion 32B joined to the internal wiring connection portion 32A, an inclined portion 32C joined to the upright portion 32B, and an external wiring connection portion 32D joined to the inclined portion 32C. The internal wiring connection portion 32A is provided with a substantially rectangular-shaped base portion 32Aa, the four sides of which are parallel to four sides of the heat radiating plate 2 in a plan view, and a comb-shaped terminal 32Ab which protrudes in the −X direction from a −X direction-side end of the base portion 32Aa. The base portion 32Aa is constituted with a plate-shaped body along the XY plane and formed in such a shape that, of four corners, a corner on the +X direction-side and also on the −Y direction-side is cut off. The comb-shaped terminal 32Ab is provided with three terminals which are arranged side by side in the Y direction. These terminals each have a crank shape which extends in the −X direction from a −X direction-side end of the base portion 32Aa and, thereafter, is bent in the −Z direction and again extends in the −X direction. The base portion 32Aa is mostly embedded into the end wall 9 and the terminal block 22.

The upright portion 32B rises up in the +Z direction from a +Y direction-side edge portion of the base portion 32Aa at the internal wiring connection portion 32A. The upright portion 32B is constituted with a plate-shaped body along the XZ plane and formed so as to be substantially equal in width to a length of the +Y direction-side edge portion of the base portion 32Aa. The upright portion 32B is embedded into the end wall 9 and the terminal block 22. The inclined portion 32C is joined to a +Z direction-side edge portion of the upright portion 32B and extends obliquely in the +Z direction toward the −Y direction. The inclined portion 32C is constituted with the plate-shaped body extending obliquely and formed so as to be substantially equal in width to the upright portion 32B. The inclined portion 32C is embedded into the end wall 9 and the terminal block 22.

The external wiring connection portion 32D is joined to a +Z direction-side edge portion of the inclined portion 32C and extends in the −Y direction. The external wiring connection portion 32D is constituted with a plate-shaped body along the XY plane and formed so as to be substantially equal in width to the inclined portion 32C. The external wiring connection portion 32D is arranged along a surface of the terminal block 22. Substantially at the central portion of the external wiring connection portion 32D, there is formed an external wiring connection-use insertion hole 32Da. A nut 36 (refer to FIG. 6) is fixed to a −Z direction-side surface of the external wiring connection portion 32D so that a screw hole is in alignment with the insertion hole 32Da. The nut 36 is embedded into the terminal block 22.

The upright portion 31B of the first power supply terminal P and the upright portion 32B of the second power supply terminal N are arranged so as to face each other, with a predetermined interval kept therebetween, thereby constituting the "plate-shaped facing portions" in the invention as claimed in the application concerned. The upright portion 31B and the inclined portion 31C of the first power supply terminal P constitute a "first coupling portion" in the invention as claimed in the application concerned. The upright portion 32B and the inclined portion 32C of the second power supply terminal N constitute a "second coupling portion" in the invention as claimed in the application concerned.

The first output terminal OUT1 is formed in such a shape that gives a plane symmetry with the first power supply terminal P with respect to the YZ plane which passes through a length center of the side wall 7. The first output terminal OUT1 is provided with an internal wiring connection portion 33A, an upright portion 33B joined to the internal wiring connection portion 33A, an inclined portion 33C joined to the upright portion 33B, and an external wiring connection portion 33D joined to the inclined portion 33C. The internal wiring connection portion 33A is provided with a substantially rectangular-shaped base portion 33Aa, the four sides of which are parallel to four sides of the heat radiating plate 2 in a plan view, and a comb-shaped terminal 33Ab which protrudes in the +X direction from a +X direction-side end of the base portion 33Aa. The base portion 33Aa is constituted with a plate-shaped body along the XY plane and formed in such a shaped that, of four corners, a corner on the −X direction-side and also on the +Y direction-side is cut off. The comb-shaped terminal 33Ab is provided with three terminals arranged side by side in the Y direction. These terminals are each provided with a crank shape which extends in the +X direction from the +X direction-side end of the base portion 33Aa, thereafter, is bent in the −Z direction and again extends in the +X direction. The base portion 33Aa is mostly embedded into the end wall 8 and the terminal block 23.

The upright portion 33B rises up in the +Z direction from a −Y direction-side edge portion of the base portion 33Aa at the internal wiring connection portion 33A. The upright portion 33B is constituted with a plate-shaped body along the XZ plane and formed so as to be substantially equal in width to a length of the −Y direction-side edge portion of the base portion 33Aa. The upright portion 33B is embedded into the end wall 8 and the terminal block 23. The inclined portion 33C is joined to a +Z direction-side edge portion of the upright portion 33B and extends obliquely in the +Z direction toward the +Y direction. The inclined portion 33C is constituted with the plate-shaped body extending obliquely and formed so as to be substantially equal in width to the upright portion 33B. The inclined portion 33C is embedded into the end wall 8 and the terminal block 23.

The external wiring connection portion 33D is joined to a +Z direction-side edge portion of the inclined portion 33C and extends in the +Y direction. The external wiring connection portion 33D is constituted with a plate-shaped body along the XY plane and formed so as to be substantially equal in width to the inclined portion 33C. The external wiring connection portion 33D is arranged along a surface of the terminal block 23. There is formed an external wiring connection-use insertion hole 33Da substantially at the central portion of the external wiring connection portion 33D. A nut (not shown) is fixed on a −Z direction-side surface of the external wiring connection portion 33D so that a screw hole is in alignment with the insertion hole 33Da. The nut is embedded into the terminal block 23.

The second output terminal OUT2 is formed in such a shape that gives a plane symmetry with the first output terminal OUT1 with respect to the XZ plane which passes through a length center of the end wall 8. The second output terminal OUT2 is provided with an internal wiring connection portion 34A, an upright portion 34B joined to the internal wiring connection portion 34A, an inclined portion 34C joined to the upright portion 34B, and an external wiring connection portion 34D joined to the inclined portion 34C. The internal wiring connection portion 34A is provided with a substantially rectangular-shaped base portion 34Aa, the four sides of which are parallel to four sides of the heat radiating plate 2 in a plan view, and a comb-shaped terminal 34Ab which protrudes in the +X direction from a +X direction-side end of the base portion 34Aa. The base portion 34Aa is constituted with a plate-shaped body along the XY plane and formed in such a shape that, of four corners, a corner on the −X direction-side and also on the −Y direction-side is cut off. The comb-shaped terminal 34Ab is provided with three terminals arranged side by side in the Y direction. These terminals are each provided with a crank shape which extends in the +X direction from the +X direction-side end of the base portion 34Aa, thereafter, is bent in the −Z direction and again extends in the +X direction. The base portion 34Aa is mostly embedded into the end wall 8 and the terminal block 24.

The upright portion 34B rises up in the +Z direction from a +Y direction-side edge portion of the base portion 34Aa at the internal wiring connection portion 34A. The upright portion 34B is constituted with a plate-shaped body along the XZ plane and formed so as to be substantially equal in width to a length of the +Y direction-side edge portion of the base portion 34Aa. The upright portion 34B is embedded into the end wall 8 and the terminal block 24. The inclined portion 34C is joined to a +Z direction-side edge portion of the upright portion 34B and extends obliquely in the +Z direction toward the −Y direction. The inclined portion 34C is constituted with the plate-shaped body extending obliquely and formed so as to be substantially equal in width to the upright portion 34B. The inclined portion 34C is embedded into the end wall 8 and the terminal block 24.

The external wiring connection portion 34D is joined to a +Z direction-side edge portion of the inclined portion 34C and extends in the −Y direction. The external wiring connection portion 34D is constituted with a plate-shaped body along the XY plane and formed so as to be substantially equal in width to the inclined portion 34C. The external wiring connection portion 34D is arranged along a surface of the terminal block 24. There is formed an external wiring connection-use insertion hole 34Da substantially at the central portion of the external wiring connection portion 34D. A nut (not shown) is fixed to a −Z direction-side surface of the external wiring connection portion 34D so that a screw hole is in alignment with the insertion hole 34Da. The nut is embedded into the terminal block 24.

The drain sense terminal DS assumes a crank shape when viewed in the X direction, and an intermediate portion thereof is embedded into the side wall 7. A base end portion of the drain sense terminal DS is arranged inside the case 3. A front end portion of the drain sense terminal DS protrudes in the +Z direction from a surface of the side wall 7.

The first source sense terminal SS1 assumes a crank shape when viewed in the X direction, and an intermediate portion thereof is embedded into the side wall 7. A base end portion of the first source sense terminal SS1 is arranged inside the case 3. A front end portion of the first source sense terminal SS1 protrudes in the +Z direction from a surface of the side wall 7.

The first gate terminal G1 assumes a crank shape when viewed in the X direction, and an intermediate portion thereof is embedded into the side wall 7. A base end portion of the first gate terminal G1 is arranged inside the case 3. A front end portion of the first gate terminal G1 protrudes in the +Z direction from a surface of the side wall 7.

The thermistor terminals T1, T2 each assume a crank shape, when viewed in the X direction, and an intermediate portion thereof is embedded into the side wall 7. Base end portions of the thermistor terminals T1, T2 are each arranged inside the case 3. Front end portions of the thermistor terminals T1, T2 each protrude in the +Z direction from a surface of the side wall 7.

The second source sense terminal SS2 assumes a crank shape when viewed in the X direction, and an intermediate portion is embedded into the side wall 6. A base end portion of the second source sense terminal SS2 is arranged inside the case 3. A front end portion of the second source sense terminal SS2 protrudes in the +Z direction from a surface of the side wall 6.

The second gate terminal G2 assumes a crank shape when viewed in the X direction, and an intermediate portion thereof is embedded into the side wall 6. A base end portion of the second gate terminal G2 is arranged inside the case 3. A front end portion of the second gate terminal G2 protrudes in the +Z direction from the surface of the side wall 6.

At an area which is surrounded by the frame portion 4 on a surface (+Z direction-side surface) of the heat radiating plate 2, a first assembly 40 and a second assembly 80 are arranged side by side in the X direction. The first assembly 40 is arranged on the sides of the power supply terminals P and N, and the second assembly 80 is arranged on the side of the output terminal OUT. The first assembly 40 constitutes a half of an upper arm (high side) circuit and a half of a lower arm (low side) circuit. The second assembly 80 constitutes a remaining half of the upper arm circuit and a remaining half of the lower arm circuit. One of the upper arm circuit and the lower arm circuit constitutes a "first circuit" of the invention as claimed in the application concerned, and the other of them constitutes a "second circuit" of the invention as claimed in the application concerned.

The first assembly 40 includes a first insulation substrate 41, a plurality of first switching elements Tr1, a plurality of first diode elements Di1, a plurality of second switching elements Tr2, a plurality of second diode elements Di2 and a thermistor Th.

The first insulation substrate 41 is formed in a substantially rectangular shape in a plan view, and four sides thereof are bonded to a surface of the heat radiating plate 2 so as to be respectively parallel to the four sides of the heat radiating plate 2. A first bonding conductor layer 42 (refer to FIG. 4) is formed on a surface (−Z direction-side surface) of the first insulation substrate 41 on the side of the heat radiating plate 2. The first bonding conductor layer 42 is bonded to the heat radiating plate 2 via a solder layer 52.

On a surface (+Z direction-side surface) which is an opposite side to the heat radiating plate 2 of the first insulation substrate 41, there are formed a plurality of upper arm circuit conductor layers, a plurality of lower arm circuit conductor layers and a plurality of thermistor conductor layers. The plurality of upper arm circuit conductor layers each include a first element bonding conductor layer 43, a first gate terminal conductor layer 44 and a first source sense terminal conductor layer 45. The plurality of lower arm circuit conductor layers each include a second element bonding-conductor layer 46, an N terminal conductor layer 47, a second gate terminal conductor layer 48, and a second source sense terminal conductor layer 49. The plurality of thermistor conductor layers each include a first thermistor terminal conductor layer 50 and a second thermistor terminal conductor layer 51.

In this preferred embodiment, the first insulation substrate 41 is made of AlN (aluminum nitride). As the first insulation substrate 41, there can be used, for example, a substrate (DBC: direct bonding copper) obtained by directly bonding copper foil on both surfaces of a ceramic. Where a DBC substrate is used as the first insulation substrate 41, the individual conductor layers 42 to 51 can be formed from the copper foil.

The first element bonding conductor layer 43 is arranged so as to be close to a side of a surface of the first insulation substrate 41 on the +Y direction-side and formed in a rectangular shape long in the X direction in a plan view. The first element bonding conductor layer 43 is provided at the +X direction-side end thereof with a projecting portion extending in the −Y direction. The N terminal conductor layer 47 is arranged so as to be close to a side of a surface of the first insulation substrate 41 on the −Y direction-side and formed in a rectangular shape long in the X direction in a plan view. The N terminal conductor layer 47 is provided at the +X direction-side end thereof with a projecting portion extending toward a projecting portion of the first element bonding conductor layer 43. The second element bonding conductor layer 46 is arranged at an area surrounded by the first element bonding conductor layer 43, the N terminal conductor layer 47 and the sides of the first insulation substrate 41 on the −X direction-side in a plan view and formed in a rectangular shape which is long in the X direction in a plan view.

The first gate terminal conductor layer 44 is arranged between the first element bonding conductor layer 43 and a side of the first insulation substrate 41 on the +Y direction-side and formed in a rectangular shape long and narrow in the X direction in a plan view. The first source sense terminal conductor layer 45 is arranged between the first gate terminal conductor layer 44 and a side of the first insulation substrate 41 on the +Y direction-side and formed in a rectangular shape long and narrow in the X direction in a plan view.

The first thermistor terminal conductor layer 50 is arranged on the +X direction-side of the first gate terminal conductor layer 44 between the first element bonding conductor layer 43 and a side of the first insulation substrate 41 on the +Y direction-side. The second thermistor terminal conductor layer 51 is arranged on the +X direction-side of the first source sense terminal conductor layer 45 between the first element bonding conductor layer 43 and a side of the first insulation substrate 41 on the +Y direction-side.

The second gate terminal conductor layer 48 is arranged between the N terminal conductor layer 47 and a side of the first insulation substrate 41 on the −Y direction-side and formed in a rectangular shape long and narrow in the X direction in a plan view. The second source sense terminal conductor layer 49 is arranged between the second gate terminal conductor layer 48 and a side of the first insulation substrate 41 on the −Y direction-side and formed in a rectangular shape long and narrow in the X direction in a plan view.

The comb-shaped terminal 31Ab of the first power supply terminal P is bonded to the +X direction-side end on a surface of the first element bonding conductor layer 43. The comb-shaped terminal 32Ab of the second power supply terminal N is bonded to the +X direction-side end on a surface of the N terminal conductor layer 47. The internal wiring connection portion 31A of the first power supply terminal P is provided with the comb-shaped terminal 31Ab and, therefore, in bonding the first power supply terminal P to the first element bonding conductor layer 43, for example, a head for ultrasonic bonding is pressed onto a tip of the comb-shaped terminal 31Ab, thus making it possible to easily ultrasonic-bond the comb-shaped terminal 31Ab to the first element bonding conductor layer 43. Moreover, the internal wiring connection portion 32A of the second power supply terminal N is provided with the comb-shaped terminal 32Ab and, therefore, in bonding the second power supply terminal N to the N terminal conductor layer 47, for example, a head for ultrasonic bonding is pressed onto the tip of the comb-shaped terminal 32Ab, thus making it possible to easily ultrasonic-bond the comb-shaped terminal 32Ab to the N terminal conductor layer 47.

A base end portion of the second gate terminal G2 is bonded to the second gate terminal conductor layer 48. A base end portion of the second source sense terminal SS2 is bonded to the second source sense terminal conductor layer 49. A base end portion of the first thermistor terminal T1 is bonded to the first thermistor terminal conductor layer 50. A base end portion of the second thermistor terminal T2 is bonded to the second thermistor terminal conductor layer 51. They may be bonded by ultrasonic welding.

A thermistor Th is arranged on the first thermistor terminal conductor layer 50 and the second thermistor terminal conductor layer 51 so as to extend astride them. One electrode of the thermistor Th is bonded to the first thermistor terminal conductor layer 50, and the other electrode thereof is bonded to the second thermistor terminal conductor layer 51.

Drain electrodes of the plurality of first switching elements Tr1 are bonded via a solder layer 53 (refer to FIG. 4) onto a surface of the first element bonding conductor layer 43, and cathode electrodes of the plurality of first diode elements Di1 are bonded via a solder layer 54. In this preferred embodiment, the solder layers 53, 54 are made of Sn—Ag—Cu-based solder. In this preferred embodiment, these solder layers 53, 54 are made thinner in thickness (for example, 0.08 mm) than a thickness of general solder (for example, 0.12 mm). Each of the first switching elements Tr1 is provided with a source electrode and a gate electrode on a surface which is an opposite side to a surface bonded to the first element bonding conductor layer 43. Each of the first diode elements Di1 is provided with an anode electrode on a surface which is an opposite side to a surface bonded to the first element bonding conductor layer 43.

Five first diode elements Di1 are arranged side by side, with an interval kept, in the X direction, so as to be close to a side of a surface of the first element bonding conductor layer 43 on the +Y direction-side. Five first switching elements Tr1 are arranged side by side, with an interval kept, in the X direction between a side of the first element bonding conductor layer 43 on the −Y direction-side and the five first diode elements Di1. The five first switching elements Tr1 are positionally in alignment with the five first diode elements Di1 with respect to the Y direction.

The first switching elements Tr1 and the first diode elements Di1 which are positionally in alignment with each other in the Y direction are connected to the second element bonding conductor layer 46 by a first connection metal member 55 extending substantially in the Y direction in a plan view. The first connection metal member 55 is formed in a rectangular shape long in the Y direction in a plan view. The first connection metal member 55 is prepared by giving a bending process to a conductive plate-shaped body (for example, a copper plate or a copper to which plate nickel plating is applied). The first connection metal member 55 is constituted with a bonding portion 55a (refer to FIG. 4) which is bonded to the second element bonding conductor layer 46, an upright portion 55b which is joined to the bonding portion 55a and a transverse portion 55c which is joined to the upright portion 55b.

The bonding portion 55a is bonded to an area close to a +Y direction-side edge of the second element bonding conductor layer 46 via a solder layer 56 and formed in a rectangular shape which extends in the X direction in a plan view. The upright portion 55b rises up in the +Z direction from a +Y direction-side edge portion of the bonding portion 55a. The upright portion 55b is constituted with a plate-shaped body along the XZ plane and formed so as to be substantially equal in width to the bonding portion 55a. The transverse portion 55c is joined to a +Z direction-side edge portion of the upright portion 55b and extends in the +Y direction. A length intermediate portion and a front end portion of the transverse portion 55c are respectively arranged above the first switching elements Tr1 and the first diode elements Di1. The transverse portion 55c is constituted with a plate-shaped body which is parallel to a principal surface of the heat radiating plate 2 and formed so as to be substantially equal in width to the upright portion 55b. A front end portion (+Y direction-side end portion) of the transverse portion 55c is bonded to an anode electrode of the first diode element Di1 via a solder layer 57, and a length intermediate portion of the transverse portion 55c is bonded to a source electrode of the first switching element Tr1 via a solder layer 58. Accordingly, the anode electrode of the first diode element Di1 and the source electrode of the first switching element Tr1 are electrically connected to the second element bonding conductor layer 46 via the first connection metal member 55.

A width (length in the X direction) of the first connection metal member 55 is shorter than a width (length in the X direction) of the first switching element Tr1. A +X direction-side edge of the transverse portion 55c of the first connection metal member 55 is positionally in alignment with a +X direction-side edge of the first switching element Tr1 and that of the first diode element Di1 in a plan view. A −X direction-side edge of the transverse portion 55c of the first connection metal member 55 is positioned closer to the +X direction-side than the −X direction-side edge of the first switching element Tr1 and that of the first diode element Di1 in a plan view. Accordingly, of the +Z direction-side surface of the first switching element Tr1 and that of the first diode element Di1, an area close to the −X direction-side edge is exposed inside the case 3.

A gate electrode of each first switching element Tr1 is connected to the first gate terminal conductor layer 44 by a wire 59. A source electrode of each first switching element Tr1 is connected to the first source sense terminal conductor layer 45 by a wire 60.

Drain electrodes of the plurality of second switching elements Tr2 are bonded to a surface of the second element bonding conductor layer 46 via a solder layer 61 (refer to FIG. 4) and also cathode electrodes of the plurality of second diode elements Di2 are bonded thereto via a solder layer 62. In this preferred embodiment, these solder layers 61, 62 are made of Sn—Ag—Cu-based solder. In this preferred embodiment, the thickness of each of the solder layers 61, 62 is made thinner (for example, 0.08 mm) than a thickness of general solder (for example, 0.12 mm). Each of the second switching elements Tr2 is provided with a source electrode and a gate electrode on a surface which is an opposite side to a surface bonded to the second element bonding conductor layer 46. Each of the second diode elements Di2 is provided with an anode electrode on a surface which is an opposite side to a surface bonded to the second element bonding conductor layer 46.

Five second switching elements Tr2 are arranged side by side, with an interval kept, in the X direction, so as to be close to a −Y direction-side on a surface of the second element bonding conductor layer 46. Moreover, five second diode elements Di2 are arranged side by side, with an interval kept, in the X direction between a side of the second element bonding conductor layer 46 on the +Y direction-side and the five second switching elements Tr2. The five second diode elements Di2 are positionally in alignment with the five second switching elements Tr2 with respect to the Y direction. Further, the five second diode elements Di2 are also positionally in alignment with the five first switching elements Tr1 with respect to the Y direction.

The second switching elements Tr2 and the second diode elements Di2 positionally in alignment with each other in the Y direction are connected to the N terminal conductor layer 47 by a second connection metal member 65 extending substantially in the Y direction in a plan view. The second connection metal member 65 is prepared by giving a bending process to a conductive plate-shaped body (for example, a copper plate or a copper plate to which nickel plating is applied). The second connection metal member 65 is constituted with a bonding portion 65a (refer to FIG. 4) bonded to the N terminal conductor layer 47, an upright portion 65b joined to the bonding portion 65a and a transverse portion 65c joined to the upright portion 65b.

The bonding portion 65a is bonded to an area close to a +Y direction-side edge of the N terminal conductor layer 47 via a solder layer 66 and formed in a rectangular shape extending in the X direction in a plan view. The upright portion 65b rises up in the +Z direction from a +Y direction-side edge portion of the bonding portion 65a. The upright portion 65b is constituted with a plate-shaped body along the XZ plane and formed so as to be substantially equal in width to the bonding portion 65a. The transverse portion 65c is joined to a +Z direction-side edge portion of the upright portion 65b and extends in the +Y direction. A length intermediate portion and a front end portion of the transverse portion 65c are respectively arranged above the second switching elements Tr2 and the second diode elements Di2. The transverse portion 65c is constituted with a plate-shaped body which is parallel to a principal surface of the heat radiating plate 2 and formed so as to be substantially equal in width to the upright portion 65b. A front end portion (+Y direction-side end portion) of the transverse portion 65c is bonded to an anode electrode of the second diode element Di2 via a solder layer 67, and a length intermediate portion of the transverse portion 65c is bonded to a source electrode of the second switching element Tr2 via a solder layer 68. Accordingly, the anode electrode of the second diode element Di2 and the source electrode of the second switching element Tr2 are electrically connected to the N terminal conductor layer 47 via the second connection metal member 65.

A width (length in the X direction) of the second connection metal member 65 is shorter than a width (length in the X direction) of the second switching element Tr2. A +X direction-side edge of the transverse portion 65c of the second connection metal member 65 is positionally in alignment with a +X direction-side edge of the second switching element Tr2 and that of the second diode element Di2 in a plan view. A −X direction-side edge of the transverse portion 65C of the second connection metal member 65 is positioned closer to the +X direction-side than the −X direction-side edge of the second switching element Tr2 and that of the second diode element Di2 in a plan view. Accordingly, of the +Z direction-side surface of the second switching element Tr2 and that of the second diode element Di2, an area close to the −X direction-side edge is exposed inside the case 3.

A gate electrode of each second switching element Tr2 is connected to the second gate terminal conductor layer 48 via a wire 69. A source electrode of each second switching element Tr2 is connected to the second source sense terminal conductor layer 49 via a wire 70.

The second assembly 80 includes a second insulation substrate 81, a plurality of third switching elements Tr3, a plurality of third diode elements Di3, a plurality of fourth switching elements Tr4 and a plurality of fourth diode elements Di4.

The first switching elements Tr1 of the first assembly 40 and/or the third switching elements Tr3 of the second assembly 80 constitute a "first switching element" of the invention as claimed in the application concerned. The second switching elements Tr2 of the first assembly 40 and/or the fourth switching elements Tr4 of the second assembly 80 constitute a "second switching element" of the invention as claimed in the application concerned. The first diode elements Di1 of the first assembly 40 and/or the third diode elements Di3 of the second assembly 80 constitute a "first diode element" of the invention as claimed in the application concerned. The second diode elements Di2 of the first assembly 40 and/or the fourth diode elements Di4 of the second assembly 80 constitute a "second diode element" of the invention as claimed in the application concerned.

The second insulation substrate 81 is formed in a substantially rectangular shape in a plan view and bonded to a surface of the heat radiating plate 2 so that the four sides thereof are parallel respectively to four sides of the heat radiating plate 2. A second bonding conductor layer 82 (refer to FIG. 5) is formed on a surface (−Z direction-side surface) of the second insulation substrate 81 on the side of the heat radiating plate 2. The second bonding conductor layer 82 is bonded to the heat radiating plate 2 via a solder layer 90.

A plurality of upper arm circuit conductor layers and a plurality of lower arm circuit conductor layers are formed on a surface (+Z direction-side surface) which is an opposite side to the heat radiating plate 2 of the second insulation substrate 81. The plurality of upper arm circuit conductor layers each include a third element bonding conductor layer 83, a third gate terminal conductor layer 84 and a third source sense terminal conductor layer 85. The plurality of lower arm circuit conductor layers each include a fourth element bonding conductor layer 86, a source conductor layer 87, a fourth gate terminal conductor layer 88 and a fourth source sense terminal conductor layer 89.

The first element bonding conductor layer 43 of the first assembly 40 and/or the third element bonding conductor layer 83 of the second assembly 80 constitute a "first element bonding conductor layer" of the invention as claimed in the application concerned. The second element bonding conductor layer 46 of the first assembly 40 and/or the fourth element bonding conductor layer 86 of the second assembly 80 constitute a "second element bonding conductor layer" of the invention as claimed in the application concerned. The N terminal conductor layer 47 of the first assembly 40 and/or the source conductor layer 87 of the second assembly 80 constitute a "second power supply terminal conductor layer" of the invention as claimed in the application concerned.

In this preferred embodiment, the second insulation substrate 81 is made of AlN (aluminum nitride). As the second insulation substrate 81, there can be used, for example, a substrate (DBC: direct bonding copper) obtained by directly bonding copper foil to both surfaces of a ceramic. Where a DBC substrate is used as the second insulation substrate 81, the individual conductor layers 82 to 89 can be formed from the copper foil.

The third element bonding conductor layer 83 is arranged so as to be close to a side of a surface of the second insulation substrate 81 on the +Y direction-side and formed in a rectangular shape which is longer in the X direction in a plan view. The third element bonding conductor layer 83 is provided at the −X direction-side end with a projecting portion extending in the +Y direction. A base end portion of the drain sense terminal DS is bonded to the projecting portion.

The source conductor layer 87 is arranged so as to be close to a side of a surface of the second insulation substrate 81 on the −Y direction-side and formed in a rectangular shape which is long in the X direction in a plan view. The fourth element bonding conductor layer 86 is formed in a T-letter shape in a plan view. The fourth element bonding conductor layer 86 is arranged between the third element bonding conductor layer 83 and the source conductor layer 87 and also includes a rectangular-shaped element bonding portion 86a longer in the X direction in a plan view and an output terminal bonding portion 86b extending along a side of the second insulation substrate 81 on the −X direction-side. A −X direction-side end of the element bonding portion 86a is coupled to a length central portion of the output terminal bonding portion 86b.

The third gate terminal conductor layer 84 is arranged between the third element bonding conductor layer 83 and a side of the second insulation substrate 81 on the +Y direction-side and formed in a rectangular shape which is long and narrow in the X direction in a plan view. The third source sense terminal conductor layer 85 is arranged between the third gate terminal conductor layer 84 and a side of the second insulation substrate 81 on the +Y direction-side and formed in a rectangular shape which is long and narrow in the X direction in a plan view.

The fourth gate terminal conductor layer 88 is arranged between the source conductor layer 87 and a side of the second insulation substrate 81 on the −Y direction-side and formed in a rectangular shape which is long and narrow in the X direction in a plan view. The fourth source sense terminal conductor layer 89 is arranged between the fourth gate terminal conductor layer 88 and a side of the second insulation substrate 81 on the −Y direction-side and formed in a rectangular shape which is long and narrow in the X direction in a plan view.

The comb-shaped terminal 33Ab of the first output terminal OUT1 and the comb-shaped terminal 34Ab of the second output terminal OUT2 are bonded to a surface of the output terminal bonding portion 86b on the fourth element bonding conductor layer 86. The internal wiring connection portion 33A of the first output terminal OUT1 is provided with the comb-shaped terminal 33Ab and, therefore, in bonding the first output terminal OUT1 to the output terminal bonding portion 86b, for example, a head for ultrasonic bonding is pressed onto the tip of the comb-shaped terminal 33Ab, thus making it possible to easily ultrasonic-bond the comb-shaped terminal 33Ab to the output terminal bonding portion 86b. Moreover, the internal wiring connection portion 34A of the second output terminal OUT2 is provided with the comb-shaped terminal 34Ab and, therefore, in bonding the second output terminal OUT2 to the output terminal bonding portion 86b, for example, a head for ultrasonic bonding is pressed onto the tip of the comb-shaped terminal 34Ab, thus making it possible to easily ultrasonic-bond the comb-shaped terminal 34Ab to the output terminal bonding portion 86b.

A base end portion of the first gate terminal G1 is bonded to the third gate terminal conductor layer 84. A base end portion of the first source sense terminal SS1 is bonded to the third source sense terminal conductor layer 85. They may be bonded by ultrasonic welding.

Drain electrodes of the plurality of third switching elements Tr3 are bonded to a surface of the third element bonding conductor layer 83 via a solder layer 91 (refer to FIG. 5) and also cathode electrodes of the plurality of third diode elements Di3 are bonded thereto via a solder layer 92. The foregoing solder layer 53 and/or the solder layer 91 constitute a "first solder layer" of the invention as claimed in the application concerned. The foregoing solder layer 54 and/or the solder layer 92 constitute a "third solder layer" of the invention as claimed in the application concerned. In this preferred embodiment, these solder layers 91, 92 are made of Sn—Ag—Cu-based solder. In this preferred embodiment, a thickness of each of the solder layers 91, 92 is made thinner (for example, 0.08 mm) than a thickness of general solder (for example, 0.12 mm). Each of the third switching elements Tr3 is provided with a source electrode and a gate electrode on a surface which is an opposite side to a surface bonded to the third element bonding conductor layer 83. Each of the third diode elements Di3 is provided with an anode electrode on a surface which is an opposite side to a surface bonded to the third element bonding conductor layer 83.

Five third diode elements Di3 are arranged side by side, with an interval kept, in the X direction so as to be close to a side of a surface of the third element bonding conductor layer 83 on the +Y direction-side. Moreover, five third switching elements Tr3 are arranged side by side, with an interval kept, in the X direction between a side of the third element bonding conductor layer 83 on the −Y direction-side and the five third diode elements Di3. The five third switching elements Tr3 are positionally in alignment with the five third diode elements Di3 with respect to the Y direction.

The third switching elements Tr3 and the third diode elements Di3 positionally in alignment with each other in the Y direction are connected to the fourth element bonding conductor layer 86 by a third connection metal member 95 extending substantially in the Y direction in a plan view. The third connection metal member 95 is prepared by giving a bending process to a conductive plate-shaped body (for example, a copper plate or a copper plate to which nickel plating is applied). The third connection metal member 95 is constituted with a bonding portion 95a (refer to FIG. 5) bonded to the fourth element bonding conductor layer 86, an upright portion 95b joined to the bonding portion 95a and a transverse portion 95c joined to the upright portion 95b.

The bonding portion 95a is bonded to an area close to a +Y direction-side edge of the fourth element bonding conductor layer 86 via a solder layer 96 and formed in a rectangular shape extending in the X direction in a plan view. The upright portion 95b rises up in the +Z direction from a +Y direction-side edge portion of the bonding portion 95a. The upright portion 95b is constituted with a plate-shaped body along the XZ plane and formed so as to be substantially equal in width to the bonding portion 95a. The transverse portion 95c is joined to a +Z direction-side edge portion of the upright portion 95b and extends in the +Y direction. A length intermediate portion and a front end portion of the transverse portion 95c are arranged respectively above the third switching elements Tr3 and the third diode elements Di3. The transverse portion 95c is constituted with a plate-shaped body parallel to a principal surface of the heat radiating plate 2 and formed so as to be substantially equal in width to the upright portion 95b. A front end portion (+Y direction-side end portion) of the transverse portion 95c is bonded to an anode electrode of the third diode element Di3 via a solder layer 97 and a length intermediate portion of the transverse portion 95c is bonded to a source electrode of the third switching element Tr3 via a solder layer 98. Accordingly, the anode electrode of the third diode element Di3 and the source electrode of the third switching element Tr3 are electrically connected to the fourth element bonding conductor layer 86 via the third connection metal member 95.

A width (length in the X direction) of the third connection metal member 95 is shorter than a width (length in the X direction) of the third switching element Tr3. The −X direction-side edge of the transverse portion 95c of the third connection metal member 95 is positionally in alignment with the −X direction-side edge of the third switching element Tr3 and that of the third diode element Di3 in a plan view. The +X direction-side edge of the transverse portion 95c of the third connection metal member 95 is positioned so as to be closer to the −X direction-side than the +X direction-side edge of the third switching element Tr3 and that of the third diode element Di3 in a plan view. Accordingly, of the +Z direction-side surface of the third switching element Tr3 and that of the third diode element Di3, an area close to the +X direction-side edge is exposed inside the case 3.

A gate electrode of each of the third switching elements Tr3 is connected to the third gate terminal conductor layer 84 by a wire 99. A source electrode of each of the third switching elements Tr3 is connected to the third source sense terminal conductor layer 85 by a wire 100.

Drain electrodes of the plurality of fourth switching elements Tr4 are bonded to a surface of the fourth element bonding conductor layer 86 via a solder layer 101 (refer to FIG. 5) and also cathode electrodes of the plurality of fourth diode elements Di4 are bonded thereto via a solder layer 102. The foregoing solder layer 61 and/or the solder layer 101 constitute a "second solder layer" of the invention as claimed in the application concerned. The foregoing solder layer 62 and/or the solder layer 102 constitute a "fourth solder layer" of the invention as claimed in the application concerned. In this preferred embodiment, these solder layers 101 and 102 are made of Sn—Ag—Cu-based solder. In this preferred embodiment, a thickness of each of the solder layers 101, 102 is made thinner (for example, 0.08 mm) than a thickness of general solder (for example, 0.12 mm). Each of the fourth switching elements Tr4 is provided with a source electrode and a gate electrode on a surface which is an opposite side to a surface bonded to the fourth element bonding conductor layer 86. Each of the fourth diode elements Di4 is provided with an anode electrode on a surface which is an opposite side to a surface bonded to the fourth element bonding conductor layer 86.

Five fourth switching elements Tr4 are arranged side by side, with an interval kept, in the X direction so as to be close to the −Y direction-side on a surface of the fourth element bonding conductor layer 86. Moreover, five fourth diode elements Di4 are arranged side by side, with an interval kept, in the X direction between a side of the fourth element bonding conductor layer 86 on the +Y direction-side and the five fourth switching elements Tr4. The five fourth diode elements Di4 are positionally in alignment with the five fourth switching elements Tr4 with respect to the Y direction. Further, the five fourth diode elements Di4 are also positionally in alignment with the five third switching elements Tr3 with respect to the Y direction.

The fourth switching elements Tr4 and the fourth diode elements Di4 positionally in alignment with each other in the Y direction are connected to the source conductor layer by a fourth connection metal member 105 extending substantially in the Y direction in a plan view. The fourth connection metal member 105 is prepared by giving a bending process to a conductive plate-shaped body (for example, a copper plate or a copper plate to which nickel plating is applied). The fourth connection metal member 105 is constituted with a bonding portion 105a (refer to FIG. 5) bonded to the source conductor layer 87, an upright portion 105b joined to the bonding portion 105a and a transverse portion 105c joined to the upright portion 105b.

The bonding portion 105a is bonded to an area close to the +Y direction-side edge of the source conductor layer 87 via a solder layer 106 and formed in a rectangular shape extending in the X direction in a plan view. The upright portion 105b rises up in the +Z direction from a +Y direction-side edge portion of the bonding portion 105a. The upright portion 105b is constituted with a plate-shaped body along the XZ plane and formed so as to be substantially equal in width to the bonding portion 105a. The transverse portion 105c is joined to a +Z direction-side edge portion of the upright portion 105b and extends in the +Y direction. A length intermediate portion and a front end portion of the transverse portion 105c are arranged respectively above the fourth switching elements Tr4 and the fourth diode elements Di4. The transverse portion 105c is constituted with a plate-shaped body parallel to a principal surface of the heat radiating plate 2 and formed so as to be substantially equal in width to the upright portion 105b. A front end portion (+Y direction-side end portion) of the transverse portion 105c is bonded to an anode electrode of the fourth diode element Di4 via a solder layer 107, and a length intermediate portion of the transverse portion 105c is bonded to a source electrode of the fourth switching element Tr4 via a solder layer 108. Accordingly, the anode electrode of the fourth diode element Di4 and the source electrode of the fourth switching element Tr4 are electrically connected to the source conductor layer 87 via the fourth connection metal member 105.

A width (length in the X direction) of the fourth connection metal member 105 is shorter than a width (length in the X direction) of the fourth switching element Tr4. A −X direction-side edge of the transverse portion 105c of the fourth connection metal member 105 is positionally in alignment with a −X direction-side edge of the fourth switching element Tr4 and that of the fourth diode element Di4 in a plan view. A +X direction-side edge of the transverse portion 105c of the fourth connection metal member 105 is positioned so as to be closer to the −X direction-side than the +X direction-side edge of the fourth switching element Tr4 and that of the fourth diode element Di4 in a plan view. Accordingly, of a +Z direction-side surface of the fourth switching element Tr4 and that of the fourth diode element Di4, an area closer to the +X direction-side edge is exposed inside the case 3.

A gate electrode of each of the fourth switching elements Tr4 is connected to the fourth gate terminal conductor layer 88 by a wire 109. A source electrode of each of the fourth switching elements Tr4 is connected to the fourth source sense terminal conductor layer 89 by a wire 110.

The third element bonding conductor layer 83 of the second assembly 80 is connected to the first element bonding conductor layer 43 of the first assembly 40 by a first conductor layer connecting member 111. The first conductor layer connecting member 111 is constituted with a conductive plate-shaped body which is H-shaped in a plan view. The first conductor layer connecting member 111 is constituted with a pair of rectangular portions extending astride the third element bonding conductor layer 83 and the first element bonding conductor layer 43 as well as a coupling portion which couples length central portions of these rectangular portions. One end portion and the other end portion of the pair of rectangular portions each constitute a comb-shaped terminal. The first element bonding conductor layer 43 is connected to the third element bonding conductor layer 83 by the first conductor layer connecting member 111 made of a plate-shaped body, by which lower inductance can be attained as compared with a case where they are connected by a wire.

Further, the first conductor layer connecting member 111 is provided with the comb-shaped terminal and, therefore, in bonding, for example, the first conductor layer connecting member 111 to the first element bonding-conductor layer 43, a head for ultrasonic bonding is pressed onto the comb-shaped terminal of the first conductor layer connecting member 111 on the +X direction-side. Thereby, it is possible to easily ultrasonic-bond the first conductor layer connecting member 111 to the first element bonding conductor layer 43.

The fourth element bonding conductor layer 86 of the second assembly 80 is connected to the second element bonding conductor layer 46 of the first assembly 40 by a second conductor layer connecting member 112. The second conductor layer connecting member 112 is constituted with a conductive plate-shaped body which is H-shaped in a plan view. The second conductor layer connecting member 112 is constituted with a pair of rectangular portions extending astride the fourth element bonding conductor layer 86 and the second element bonding conductor layer 46 as well as a coupling portion which couples length central portions of these rectangular portions. One end portion and the other end portion of the pair of rectangular portions each constitute a comb-shaped terminal. The second element bonding conductor layer 46 is connected to the fourth element bonding conductor layer 86 by the second conductor layer connecting member 112 made of a plate-shaped body, by which lower inductance can be attained as compared with a case where they are connected by a wire.

Further, the second conductor layer connecting member 112 is provided with the comb-shaped terminal and, therefore, in bonding, for example, the second conductor layer connecting member 112 to the second element bonding conductor layer 46, a head for ultrasonic bonding is pressed onto the comb-shaped terminal of the second conductor layer connecting member 112 on the +X direction-side. Thereby, it is possible to easily ultrasonic-bond the second conductor layer connecting member 112 to the second element bonding conductor layer 46.

The source conductor layer 87 of the second assembly 80 is connected to the N terminal conductor layer 47 of the first assembly 40 by a third conductor layer connecting member 113. The third conductor layer connecting member 113 is constituted with a conductive plate-shaped body which is H-shaped in a plan view. The third conductor layer connecting member 113 is constituted with a pair of rectangular portions extending astride the source conductor layer 87 and the N terminal conductor layer 47 as well as a coupling portion which couples length central portions of these rectangular portions. One end portion and the other end portion of the pair of rectangular portions each constitute a comb-shaped terminal. The N terminal conductor layer 47 is connected to the source conductor layer 87 by the third conductor layer connecting member 113 made of a plate-shaped body, by which lower inductance can be attained as compared with a case where they are connected by a wire. Further, the third conductor layer connecting member 113 is provided with the comb-shaped terminal and, therefore, in bonding, for example, the third conductor layer connecting member 113 to the N terminal conductor layer 47, a head for ultrasonic bonding is pressed onto the comb-shaped terminal of the third conductor layer connecting member 113 on the +X direction-side. Thereby, it is possible to easily ultrasonic-bond the third conductor layer connecting member 113 to the N terminal conductor layer 47.

The third gate terminal conductor layer 84 of the second assembly 80 is connected to the first gate terminal conductor layer 44 of the first assembly 40 via a wire 114. The third source sense terminal conductor layer 85 of the second assembly 80 is connected to the first source sense terminal conductor layer 45 of the first assembly 40 via a wire 115.

Figure 9:
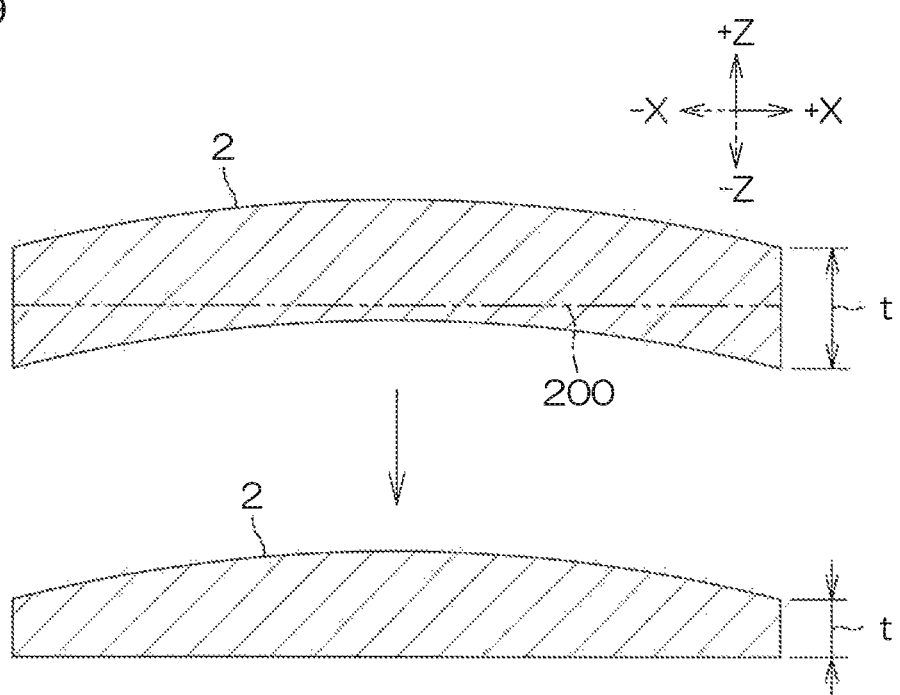
FIG. 9 is a drawing which explains that a rear surface of a heat radiating plate is polished to reduce the thickness of the heat radiating plate.

The fourth gate terminal conductor layer 88 of the second assembly 80 is connected to the second gate terminal conductor layer 48 of the first assembly 40 via a wire 116. The fourth source sense terminal conductor layer 89 of the second assembly 80 is connected to the second source sense terminal conductor layer 49 of the first assembly 40 via a wire 117.

Where the first assembly 40 and the second assembly 80 are assembled to the heat radiating plate 2, the heat radiating plate 2 is warped so that the central portion thereof is protruded as shown at an upper side of FIG. 9. In this preferred embodiment, after the first assembly 40 and the second assembly 80 are assembled to the heat radiating plate 2, a lower surface (surface in the −Z direction) of the heat radiating plate 2 is polished until it gives a flat surface as indicated by a double dotted and dashed line 120. Accordingly, as shown at a lower side of FIG. 9, there is provided a heat radiating plate 2 which is thinner than the heat radiating plate 2 shown at the upper side of FIG. 9. In this preferred embodiment, a thickness t of a peripheral edge portion of the heat radiating plate 2 shown at the upper side of FIG. 9 is, for example, about 4 mm, while a thickness t of a peripheral edge portion of the heat radiating plate 2 shown at the lower side of FIG. 9 is, for example, about 3.5 mm.

Figure 10:
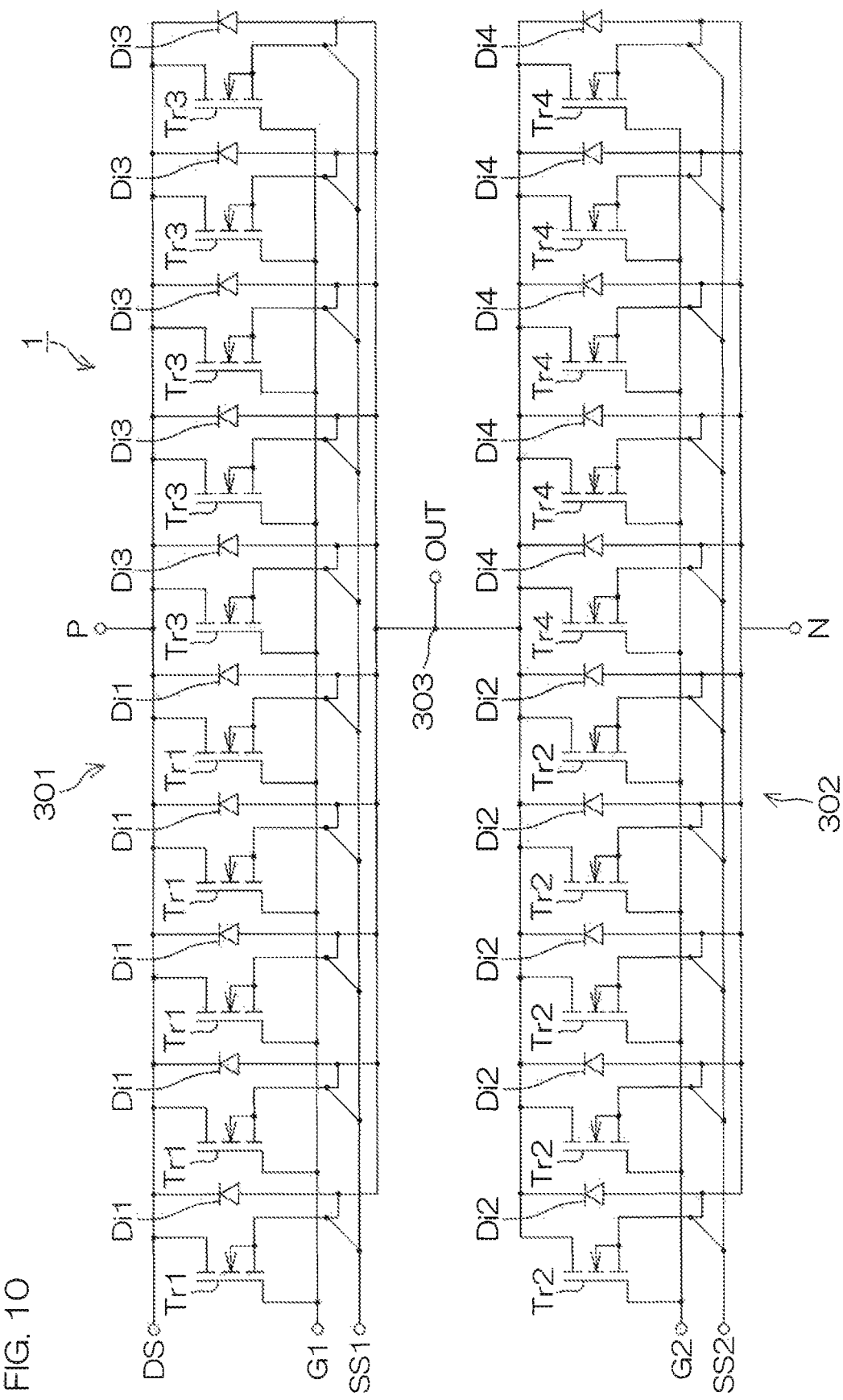
FIG. 10 is an electric circuit diagram which explains an electric constitution of a power module.

FIG. 10 is an electric circuit diagram for explaining an electric constitution of the power module 1. In FIG. 10, two output terminals OUT1 and OUT2 are shown as one output terminal OUT.

The plurality of first switching elements Tr1 and the plurality of first diode elements Di1 installed at the first assembly 40 as well as the plurality of third switching elements Tr3 and the plurality of third diode elements Di3 installed at the second assembly 80 are connected in parallel between the first power supply terminal P and the output terminal OUT, thereby forming an upper arm circuit (high side circuit) 301. The plurality of second switching elements Tr2 and the plurality of second diode elements Di2 installed at the first assembly 40 as well as the plurality of fourth switching elements Tr4 and the plurality of fourth diode elements Di4 installed at the second assembly 80 are connected between the output terminal OUT and the second power supply terminal N, thereby forming a lower arm circuit (low-side circuit) 302.

The upper arm circuit 301 and the lower arm circuit 302 are connected in series between the first power supply terminal P and the second power supply terminal N, and the output terminal OUT is connected to a connecting point 303 between the upper arm circuit 301 and the lower arm circuit 302. In this way, a half bridge circuit is constituted. The half bridge circuit can be used as a single-phase bridge circuit. Further, the plural number (for example, three) of half bridge circuits (power module 1) are connected to a power supply in parallel, by which a plural-phase (for example, three-phase) bridge circuit can be constituted.

The first to fourth switching elements Tr1 to Tr4 are, in this preferred embodiment, constituted with N-channel DMOS (double-diffused metal oxide semiconductor) field-effect transistors. Particularly, in this preferred embodiment, the first to fourth switching elements Tr1 to Tr4 are high-speed switching MOSFETs (SiC-DMOS) constituted with SiC semiconductor devices.

Moreover, the first to fourth diode elements Di1 to Di4 are, in this preferred embodiment, constituted with Schottky barrier diodes (SBD). Particularly, in this preferred embodiment, the first to fourth diode elements Di1 to Di4 are constituted with SiC semiconductor devices (SiC-SBDs).

The first diode elements Di1 are connected in parallel to the individual first switching elements Tr1. The third diode elements Di3 are connected in parallel to the individual third switching elements Tr3. A drain of each of the first switching elements Tr1 and that of each of the third switching elements Tr3 as well as a cathode of each of the first diode elements Di1 and that of each of the third diode elements Di3 are connected to the first power supply terminal P.

Anodes of the plurality of first diode elements Di1 are connected to sources of the corresponding first switching elements Tr1, and the sources of the first switching elements Tr1 are connected to the output terminal OUT. Similarly, anodes of the plurality of third diode elements Di3 are connected to sources of the corresponding third switching elements Tr3, and the sources of the third switching elements Tr3 are connected to the output terminal OUT.

Gates of the plurality of first switching elements Tr1 and those of the plurality of third switching elements Tr3 are connected to the first gate terminal G1. The sources of the plurality of first switching elements Tr1 and those of the plurality of third switching elements Tr3 are connected to the first source sense terminal SS1 as well. Drains of the plurality of first switching elements Tr1 and those of the plurality of third switching elements Tr3 are connected to the drain sense terminal DS as well.

The second diode elements Di2 are connected in parallel to the individual second switching elements Tr2. The fourth diode elements Di4 are connected in parallel to the individual fourth switching elements Tr4. A drain of each of the second switching elements Tr2 and that of each of the fourth switching elements Tr4 as well as a cathode of each of the second diode elements Di2 and that of each of the fourth diode elements Di4 are connected to the output terminal OUT.

Anodes of the plurality of second diode elements Di2 are connected to sources of the corresponding second switching elements Tr2, and the sources of the second switching elements Tr2 are connected to the second power supply terminal N. Similarly, anodes of the plurality of fourth diode elements Di4 are connected to sources of the corresponding fourth switching elements Tr4, and the sources of the fourth switching elements Tr4 are connected to the second power supply terminal N.

Gates of the plurality of second switching elements Tr2 and those of the plurality of fourth switching elements Tr4 are connected to the second gate terminal G2. The sources of the plurality of second switching elements Tr2 and those of the plurality of fourth switching elements Tr4 are also connected to the second source sense terminal SS2.

Figure 11:
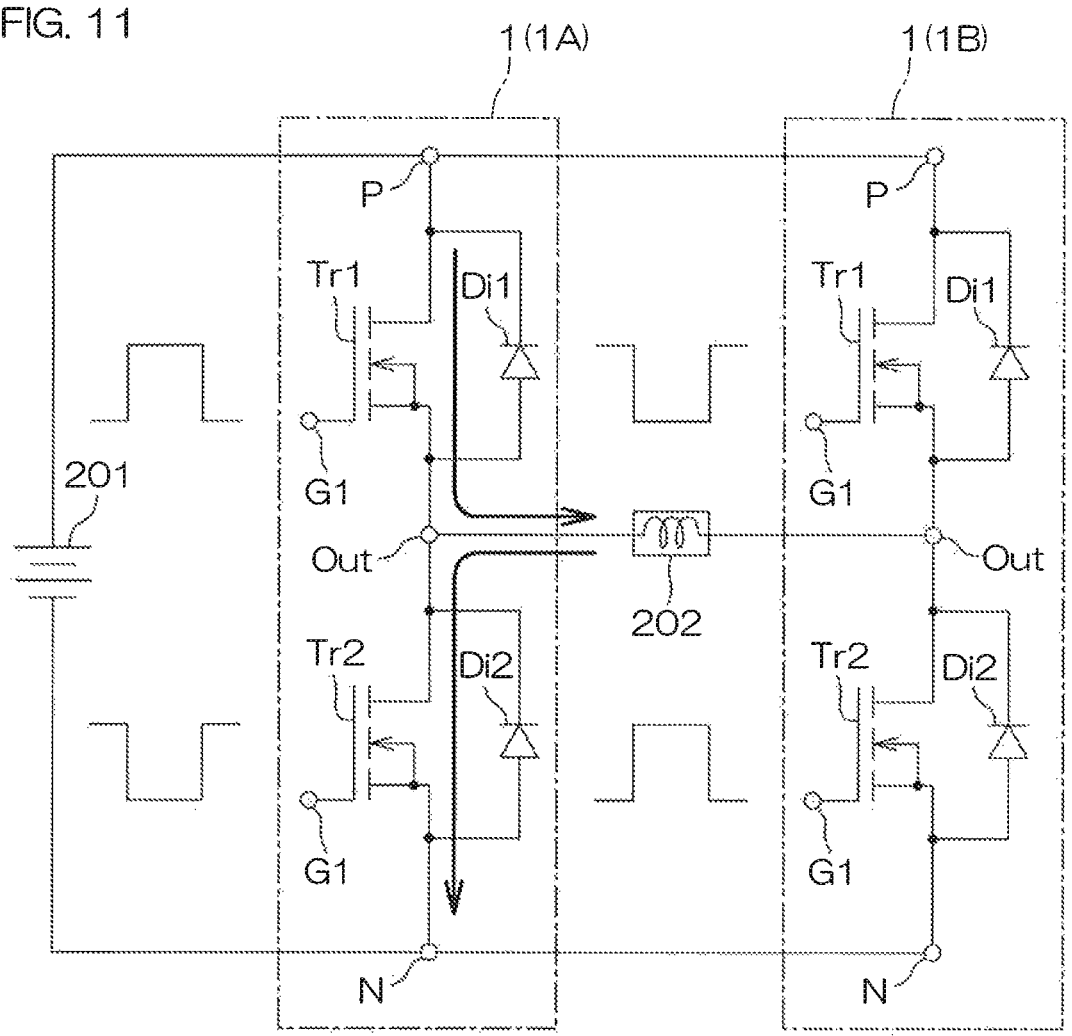
FIG. 11 is an electric circuit diagram which shows an electric circuit where the power module is used in an H bridge circuit.

FIG. 11 shows an electric circuit in which the power module 1 is used at an H bridge circuit. In the H bridge circuit, two power modules 1 are connected in parallel to a power supply 201. One of the power modules 1 is called a first power module 1A, and the other of the power modules 1 is called a second power module 1B. In FIG. 11, for convenience of description, the plurality of first and third switching elements Tr1, Tr3 and the plurality of first and third diode elements Di1, Di3 which constitute the upper arm circuit are expressed respectively by one first switching element Tr1 and one first diode element Di1. Similarly, the plurality of second and fourth switching elements Tr2, Tr4 and the plurality of second and fourth diode elements Di2, Di4 which constitute the lower arm circuit are expressed respectively by one second switching element Tr2 and one second diode element Di2. An inductive load 202 such as a motor is connected between the output terminals OUT of the two power modules 1A and 1B.

In the above-described H bridge circuit, for example, the first switching elements Tr1 of the first power module 1A and the second switching elements Tr2 of the second power module 1B are kept in a conductive state. Thereafter, these switching elements Tr1, Tr2 are kept in a cutoff state. Then, the second switching elements Tr2 of the first power module 1A and the first switching elements Tr1 of the second power module 1B are kept in a conductive state. Thereafter, these switching elements Tr1, Tr2 are kept in a cutoff state. Then, the first switching elements Tr1 of the first power module 1A and the second switching elements Tr2 of the second power module 1B are kept in a conductive state. These motions are repeated, by which the load 202 is AC driven.

During a transition period when the first switching elements Tr1 inside the first power module 1A are switched from a conductive state to a cutoff state and the second switching elements Tr2 are switched from a cutoff state to a conductive state, as shown by the arrows in FIG. 11, in the first power module 1A, a current flows from the first power supply terminal P through the first switching elements Tr1 to the output terminal OUT and flows from the output terminal OUT through the second switching elements Tr2 to the second power supply terminal N. Also during a transition period when the second switching elements Tr2 inside the first power module 1A are switched from a conductive state to a cutoff state and the first switching elements Tr1 are switched from a cutoff state to a conductive state, in the first power module 1A, a current flows from the first power supply terminal P through the first switching element Tr1 to the output terminal OUT and flows from the output terminal OUT through the second switching element Tr2 to the second power supply terminal N.

With reference to FIG. 7 and FIG. 8, during the transition period, a current flows through the upright portion 31B of the first power supply terminal P at the first power module 1A mainly in the −Z direction (a direction from the side of the external wiring connection portion 31D to the side of the internal wiring connection portion 31A). On the other hand, a current flows through the upright portion 32B of the second power supply terminal N at the first power module 1A mainly in the +Z direction (a direction from the side of the internal wiring connection portion 32A to the side of the external wiring connection portion 32D).

The upright portion 31B of the first power supply terminal P through which a current flows in the −Z direction and the upright portion 32B of the second power supply terminal N through which a current flows in the +Z direction face each other and also come close to each other. Accordingly, self-inductance of the first power supply terminal P and self-inductance of the second power supply terminal N are cancelled out at least partially by mutual inductance between them. Thereby, it is possible to reduce inductance of the power module 1.

It is preferable that the upright portion 31B of the first power supply terminal P and the upright portion 32B of the second power supply terminal N are 5 mm or more in height H (refer to FIG. 8), 14 mm or more in width (length in the X direction) W (refer to FIG. 7) and 2 mm or less in clearance d between them (refer to FIG. 8). In this preferred embodiment, H is equal to 5.5 mm, W is equal to 16.75 mm and d is equal to 1 mm.

In this preferred embodiment, a source electrode of each of the switching elements Tr1, Tr2, Tr3, Tr4 and an anode electrode of each of the diode elements Di1, Di2, Di3, Di4 are electrically connected to the conductor layers 46, 47, 86, 87 not by using a wire but by using the connection metal members 55, 65, 95, 105, each of which is made of a plate-shaped body. Thereby, it is possible to reduce thermal resistance of the power module 1.

Figure 12:
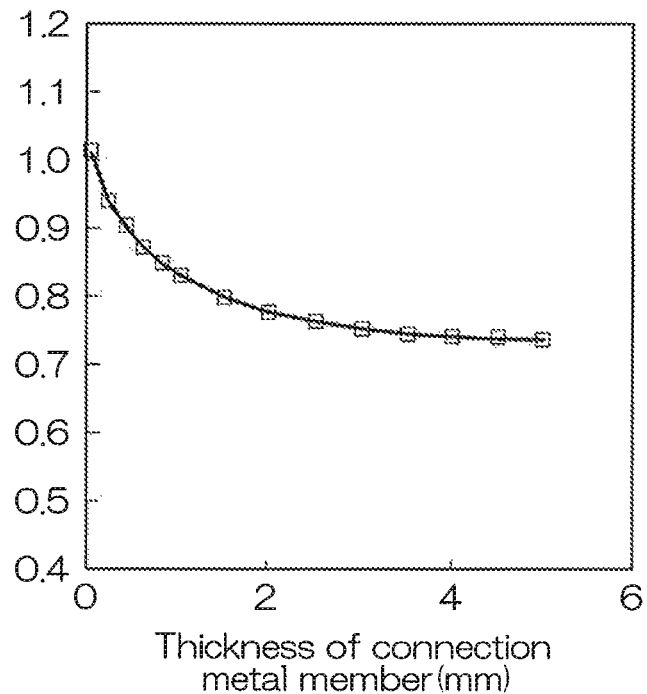
FIG. 12 is a graph which shows a ratio of thermal resistance of the power module on the use of a flat plate-shaped connection metal member with respect to thermal resistance of the power module on the use of a wire in place of the flat plate-shaped connection metal member in terms of thermal resistance ratio.

FIG. 12 is a graph which shows a ratio of thermal resistance of the power module on the use of the flat plate-shaped connection metal members 55, 65, 95, 105 with respect to thermal resistance of the power module on the use of a wire in place of the flat plate-shaped connection metal members 55, 65, 95, 105 in terms of a thermal resistance ratio. In FIG. 12, the horizontal axis corresponds to the thickness (length in the Z direction) of each of the connection metal members 55, 65, 95, 105, and the vertical axis corresponds to the thermal resistance ratio.

It is apparent from FIG. 12 that the greater the thickness of each of the connection metal members 55, 65, 95, 105, the smaller the thermal resistance of the power module 1. This is because the connection metal members 55, 65, 95, 105 are increased in heat radiating effects on heat generated at the switching elements Tr1 to Tr4 and the diode elements Di1 to Di4 with an increase in thickness of each of the connection metal members 55, 65, 95, 105. However, it is apparent that even if the thickness of each of the connection metal members 55, 65, 95, 105 is greater than 2 mm, thermal resistance of the power module 1 is not decreased so much. Therefore, it is preferable that the thickness of each of the connection metal members 55, 65, 95, 105 is from 0.8 mm or more to 2.0 mm or less. In this preferred embodiment, the thickness of each of the connection metal members 55, 65, 95, 105 is 1.0 mm, and thermal resistance of the power module 1 can be reduced by about 15% as compared with a case where a wire is used in place of the connection metal members 55, 65, 95, 105.

In this preferred embodiment, as described previously, the rear surface of the heat radiating plate 2 is polished to make thinner the heat radiating plate 2. Accordingly, it is possible to reduce thermal resistance of the power module 1.

Figure 13:
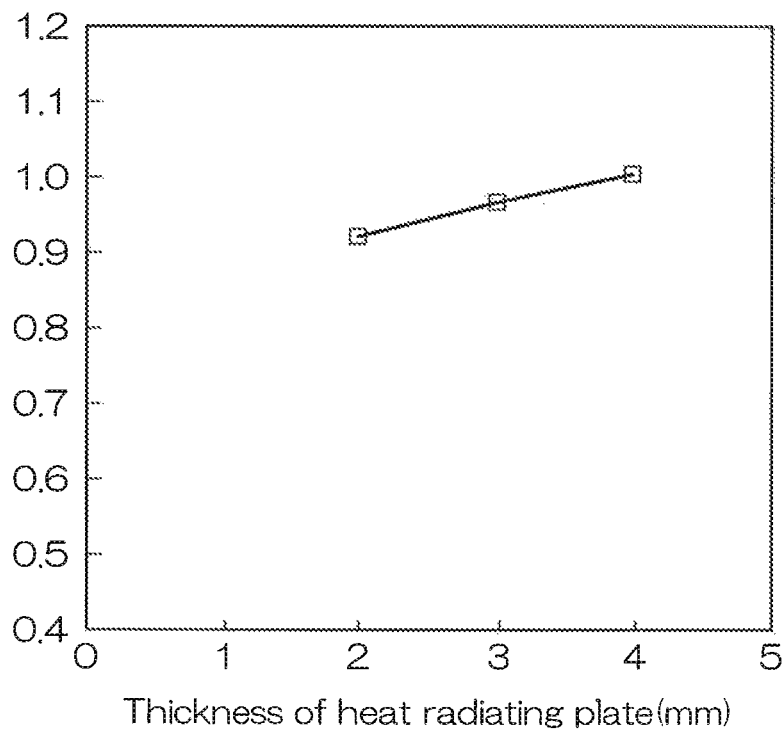
FIG. 13 is a graph which shows a ratio of thermal resistance of the power module where the rear surface of the heat radiating plate is polished with respect to thermal resistance of the power module where the rear surface of the heat radiating plate is not polished in terms of a thermal resistance ratio.

FIG. 13 is a graph which shows a ratio of thermal resistance of the power module where the rear surface of the heat radiating plate 2 is polished with respect to thermal resistance of the power module where the rear surface of the heat radiating plate 2 is not polished in terms of a thermal resistance ratio. In FIG. 13, the horizontal axis corresponds to the thickness (length in the Z direction) of a peripheral edge portion of the heat radiating plate 2, and the vertical axis corresponds to the thermal resistance ratio. In FIG. 13, the thickness of the heat radiating plate 2 is 4 mm where the rear surface of the heat radiating plate 2 is not polished.

It is apparent from FIG. 13 that the more the heat radiating plate 2 is polished to be made thinner, the smaller the thermal resistance of the power module is. This is because when the heat radiating plate 2 is decreased in thickness, heat generated at the switching elements Tr1 to Tr4 and the diode elements Di1 to Di4 is easily transmitted to cooling means such as a heat sink mounted on the rear surface (surface on the −Z direction-side) of the heat radiating plate 2. Therefore, it is preferable that the rear surface of the heat radiating plate 2 is polished to make thin the heat radiating plate 2. In this preferred embodiment, the peripheral edge portion of the heat radiating plate 2 is 3.5 mm in thickness, and thermal resistance of the power module 1 can be reduced by about 2% as compared with a case where the rear surface of the heat radiating plate 2 is not polished.

In this preferred embodiment, a thickness of each of the solder layers 53, 61, 91, 101 for bonding respectively the switching elements Tr1, Tr2, Tr3, Tr4 to the element bonding conductor layers 43, 46, 83, 86 is made thinner than a thickness of general solder. Accordingly, it is possible to reduce thermal resistance of the power module 1.

Figure 14:
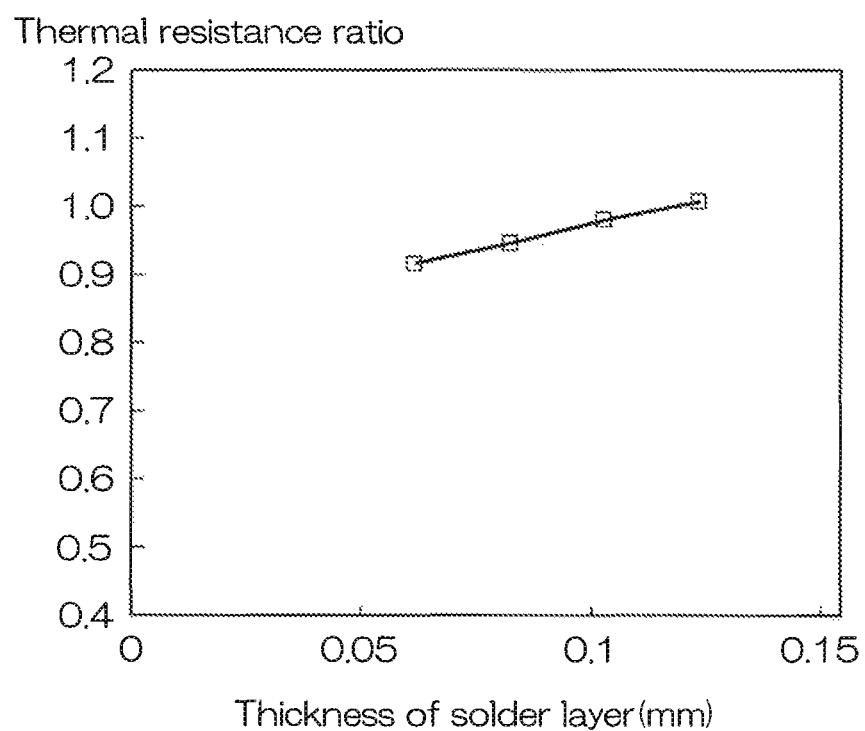
FIG. 14 is a graph which shows a ratio of thermal resistance of the power module where the thickness of a solder layer for bonding a switching element to a conductor layer is made thinner than a reference value with respect to thermal resistance of the power module where the thickness of the solder layer is equal to the reference value in terms of a thermal resistance ratio.

FIG. 14 is a graph which shows a ratio of thermal resistance of the power module where a thickness of each of the solder layers 53, 61, 91, 101 is made thinner than a reference value with respect to thermal resistance of the power module where the thickness of each of the solder layers 53, 61, 91, 101 is equal to the reference value in terms of a thermal resistance ratio. In FIG. 14, the horizontal axis corresponds to the thickness of each of the solder layers 53, 61, 91, 101, and the vertical axis corresponds to the thermal resistance ratio. In FIG. 14, the reference value of the thickness of each of the solder layers 53, 61, 91, 101 is to be 0.12 mm.

It is apparent from FIG. 14 that the thinner the thickness of each of the solder layers 53, 61, 91, 101 is made, the smaller the thermal resistance of the power module 1 becomes. This is because when the thickness of each of the solder layers 53, 61, 91, 101 is made thin, heat generated at the switching elements Tr1 to Tr4 is easily transmitted to the heat radiating plate 2. Therefore, it is preferable that the thickness of each of the solder layers 53, 61, 91, 101 is from 0.08 mm or more to 0.10 mm or less. In this preferred embodiment, the thickness of each of the solder layers 53, 61, 91, 101 is 0.08 mm, and thermal resistance of the power module 1 can be reduced by about 2% as compared with a case where the thickness of each of the solder layers 53, 61, 91, 101 is 0.12 mm.

A description has been so far given of the preferred embodiment of the present invention. The present invention can be carried out by another preferred embodiment. For example, in the foregoing preferred embodiment, a MOS field-effect transistor constituted with a SiC semiconductor device has been described as an example of a switching element. Other modes of switching elements such as an IGBT (insulated gate bipolar transistor) may be applied. Further, in the foregoing preferred embodiment, a description has been given of a constitution equipped with a switching element and a diode element. However, the present invention is even applicable to a semiconductor device which is not equipped with a diode element. Moreover, the semiconductor device is not necessarily required to constitute a power module.

Although the preferred embodiments of the present invention have been described in detail, they are merely specific examples used to clarify the technical contents of the present invention. Therefore, the present invention shall not be construed as being restricted to these specific examples and shall be limited only by the scope of attached claims of the present invention.

This application corresponds to Japanese Patent Application No. 2015-37225 filed on Feb. 26, 2015 in the Japan Patent Office, and entire disclosures of the application are herein incorporated by reference.

REFERENCE SIGNS LIST

1 Semiconductor module
2 Heat radiating plate
21-24 Terminal block
31A Internal wiring connection portion
31Aa Base portion
31Ab Comb-shaped terminal
31B Upright portion
31C Inclined portion
31D External wiring connection portion
32A Internal wiring connection portion
32Aa Base portion
32Ab Comb-shaped terminal
32B Upright portion
32C Inclined portion
32D External wiring connection portion
40 First assembly
41 First insulation substrate
42 First bonding conductor layer
43 First element bonding conductor layer
46 Second element bonding conductor layer
47 N terminal conductor layer
55 First connection metal member
65 Second connection metal member
80 Second assembly
81 Second insulation substrate
82 Second bonding conductor layer
83 Third element bonding conductor layer
84 Third gate terminal conductor layer
85 Third source sense terminal conductor layer
86 Fourth element bonding conductor layer
87 Source conductor layer
95 Third connection metal member
105 Fourth connection metal member
P First power supply terminal
N Second power supply terminal
OUT1 First output terminal
OUT2 Second output terminal
Tr1 to Tr4 Switching element
Di1 to Di4 Diode element

The invention claimed is:
1. A semiconductor device, comprising:
a first power supply terminal and a second power supply terminal which are arranged so as to be adjacent in a predetermined one direction in a plan view; and
a circuit element which is electrically connected between the first power supply terminal and the second power supply terminal; wherein,
the first power supply terminal includes a first internal wiring connection portion and a first external wiring connection portion which are flat plate-shaped and arranged so as to face each other, with an interval kept, in a vertical direction along a plan view direction and a first coupling portion which couples an edge portion of the first internal wiring connection portion and that of the first external wiring connection portion on the side of the second power supply terminal,
the second power supply terminal includes a second internal wiring connection portion and a second external wiring connection portion and a second coupling portion which couples the second internal wiring connection portion and the second external wiring connection portion and is disposed adjacent to the first coupling portion, and
the first coupling portion and the second coupling portion are opposed to each other, and at least a part of the first connecting part and at least a part of the second connecting part extend in the vertical direction.

2. The semiconductor device according to claim 1, wherein,
the first coupling portion and the second coupling portion each include plate-shaped facing portions facing each other, with a predetermined interval kept therebetween.

3. The semiconductor device according to claim 1, wherein,
the first internal wiring connection portion and the first external wiring connection portion which are arranged so as to face each other, with an interval kept, and
the second internal wiring connection portion and the second external wiring connection portion which are arranged so as to face each other, with an interval kept.

4. The semiconductor device according to claim 1, wherein,
the first internal wiring connection portion, the second internal wiring connection portion and the circuit element are sealed inside a case.

5. The semiconductor device according to claim 1, wherein,
the circuit element includes a first switching element and a second switching element which are cascaded to take out output from a connection portion between the first switching element and the second switching element.

6. The semiconductor device according to claim 5, wherein,
the first switching element and the second switching element each include a diode element which is connected in parallel in a reverse direction.

7. The semiconductor device according to claim 5, wherein
the first switching element and the second switching element are each made of SiC MOSFET or IGBT.

8. The semiconductor device according to claim 5, wherein,
the first switching element has a plurality of switching elements connected in parallel, and
the second switching element has a plurality of switching elements connected in parallel.

9. The semiconductor device according to claim 5, wherein,
a distance between the first coupling portion and the second coupling portion is shorter than a distance between an output terminal to which the output is connected and the first power supply terminal or the second power supply terminal.

10. The semiconductor device according to claim 1, wherein,
a clearance between the first coupling portion and the second coupling portion is 2 mm or less.

11. The semiconductor device according to claim 1, comprising:
a circuit substrate on which the circuit element is mounted; wherein,
the circuit substrate is formed in a substantially rectangular shape in a plan view, and the first power supply terminal and the second power supply terminal are mounted at an end of a circuit substrate in the longitudinal direction.

12. The semiconductor device according to claim 11, wherein,
the first internal wiring connecting portion and the second internal wiring connecting portion are connected to the circuit substrate by solder.

* * * * *